(12) United States Patent
Sucha et al.

(10) Patent No.: US 8,265,105 B2
(45) Date of Patent: Sep. 11, 2012

(54) SCANNING TEMPORAL ULTRAFAST DELAY AND METHODS AND APPARATUSES THEREFOR

(75) Inventors: Gregg D. Sucha, Ann Arbor, MI (US); Martin E. Fermann, Ann Arbor, MI (US); Donald J. Harter, Ann Arbor, MI (US)

(73) Assignee: IMRA America, Inc., Ann Arbor, MI (US)

( * ) Notice: Subject to any disclaimer, the term of this patent is extended or adjusted under 35 U.S.C. 154(b) by 172 days.

(21) Appl. No.: 12/511,204

(22) Filed: Jul. 29, 2009

(65) Prior Publication Data

US 2009/0296749 A1  Dec. 3, 2009

Related U.S. Application Data

(60) Continuation of application No. 10/050,716, filed on Jan. 18, 2002, now Pat. No. 7,580,432, which is a division of application No. 08/602,457, filed on Feb. 16, 1996, now Pat. No. 5,778,016, which is a continuation-in-part of application No. 08/221,516, filed on Apr. 1, 1994, now Pat. No. 5,585,913.

(51) Int. Cl.
   *H01S 3/30* (2006.01)
(52) U.S. Cl. ............... 372/6; 372/30; 372/33; 372/34
(58) Field of Classification Search ............. 372/6, 30, 372/33
   See application file for complete search history.

(56) References Cited

U.S. PATENT DOCUMENTS

| | | | |
|---|---|---|---|
| 3,626,319 A | 12/1971 | Young | |
| 3,669,541 A | 6/1972 | Duguay | ........................ 356/5 |
| 3,806,829 A | 4/1974 | Duston et al. | |
| 4,025,875 A | 5/1977 | Fletcher et al. | .................. 372/30 |
| 4,097,148 A | 6/1978 | Fry | ..................................... 356/5 |

(Continued)

FOREIGN PATENT DOCUMENTS

DE    195 12 447 A1    10/1995
(Continued)

OTHER PUBLICATIONS

J.D. Kafka, Two-color subpicosecond optical sampling technique, Optics Letters, Sep. 15, 1992, pp. 1286-1288, vol. 17, No. 18.

(Continued)

*Primary Examiner* — Dung Nguyen
(74) *Attorney, Agent, or Firm* — Sughrue Mion, PLLC

(57) ABSTRACT

The present invention is directed to methods and apparatuses for performing temporal scanning using ultra-short pulse-width lasers in which only minimal (micro-scale) mechanical movement is required. The invention also relates to methods for obtaining high-accuracy timing calibration, on the order of femtoseconds. A dual laser system is disclosed in which the cavity of one or more of the lasers is dithered, by using a piezoelectric element. A Fabry-Perot etalon is used to generate a sequence of timing pulses used in conjunction with a laser beam produced by the laser having the dithered laser cavity. A correlator correlates a laser pulse from one of the lasers with the sequence of timing pulses to produce a calibrated time scale. The methods and apparatuses of the present invention are applicable to many applications requiring rapid scanning and time calibration, including, but not limited to metrology, characterization of charge dynamics in semiconductors, electro-optic testing of ultrafast electronic and opto-electronic devices, optical time domain reflectometry, and electro-optic sampling oscilloscopes.

16 Claims, 18 Drawing Sheets

U.S. PATENT DOCUMENTS

| | | | |
|---|---|---|---|
| 4,212,191 A | 7/1980 | Ethridge | |
| 4,229,079 A | 10/1980 | Wayne et al. | |
| 4,377,036 A | 3/1983 | Dangschat | 33/125 |
| 4,380,391 A | 4/1983 | Buser et al. | |
| 4,606,639 A | 8/1986 | Mottier et al. | 356/358 |
| 4,613,752 A | 9/1986 | Davis | |
| 4,619,529 A | 10/1986 | Iuchi et al. | 356/358 |
| 4,660,978 A | 4/1987 | Wu | 356/353 |
| 4,708,481 A | 11/1987 | Mori et al. | 356/358 |
| 4,729,653 A | 3/1988 | Kobayashi | 356/4.5 |
| 4,730,886 A | 3/1988 | Hicks | |
| 4,736,378 A | 4/1988 | Myslinski | |
| 4,767,197 A | 8/1988 | Yeh | 350/354 |
| 4,767,210 A | 8/1988 | Kashyap | 356/345 |
| 4,830,486 A | 5/1989 | Goodwin | 356/5 |
| 4,835,778 A | 5/1989 | Kafka et al. | |
| 4,847,843 A | 7/1989 | Byron et al. | |
| 4,884,283 A | 11/1989 | Rahn et al. | |
| 4,886,363 A | 12/1989 | Jungquist | |
| 4,896,324 A | 1/1990 | Ball | |
| 4,955,025 A | 9/1990 | Mears | |
| 4,973,160 A | 11/1990 | Takiguchi et al. | 356/345 |
| 4,978,219 A | 12/1990 | Bessho | 356/349 |
| 4,995,105 A | 2/1991 | Weschsler | |
| 5,037,206 A | 8/1991 | Etzkorn et al. | 356/358 |
| 5,050,988 A | 9/1991 | Sugiyama et al. | 356/121 |
| 5,056,885 A | 10/1991 | Chinn | |
| 5,106,191 A | 4/1992 | Ohtsuka | 356/349 |
| 5,125,066 A * | 6/1992 | Ishiguro et al. | 385/142 |
| 5,166,751 A | 11/1992 | Massig | 356/359 |
| 5,166,940 A | 11/1992 | Tumminelli et al. | |
| 5,170,217 A | 12/1992 | Nishimoto et al. | 356/359 |
| 5,172,186 A | 12/1992 | Hosoe | 356/358 |
| 5,179,612 A | 1/1993 | Rochester et al. | |
| 5,181,214 A | 1/1993 | Berger et al. | |
| 5,189,489 A | 2/1993 | Brunfeld | 356/358 |
| 5,194,918 A | 3/1993 | Kino et al. | 356/359 |
| 5,218,610 A | 6/1993 | Dixon | |
| 5,237,576 A | 8/1993 | DiGiovanni et al. | |
| 5,299,170 A | 3/1994 | Shibata et al. | 356/345 |
| 5,367,529 A | 11/1994 | Holsinger | |
| 5,396,506 A | 3/1995 | Ball | |
| 5,425,039 A | 6/1995 | Hsu et al. | |
| 5,585,913 A | 12/1996 | Hariharan et al. | |
| 5,590,142 A | 12/1996 | Shan | |
| 5,646,774 A | 7/1997 | Takara et al. | |
| 5,704,960 A | 1/1998 | Evans et al. | 372/6 |
| 5,708,670 A | 1/1998 | Pfeiffer | |
| 5,717,450 A | 2/1998 | Hutt et al. | |
| 5,717,712 A | 2/1998 | Swaminathan et al. | |
| 5,778,014 A | 7/1998 | Islam | 372/6 |
| 5,778,016 A | 7/1998 | Sucha et al. | |
| 5,818,590 A | 10/1998 | Patterson | |
| 5,889,803 A | 3/1999 | Pfeiffer et al. | |
| 5,920,583 A * | 7/1999 | Chen et al. | 372/34 |
| 6,501,551 B1 | 12/2002 | Tearney et al. | |

FOREIGN PATENT DOCUMENTS

| | | |
|---|---|---|
| DE | 19512447 A1 | 10/1995 |
| DE | 19520663 A | 12/1996 |
| JP | 61-230024 | 10/1986 |
| JP | 64-006720 | 1/1989 |
| JP | 01-149032 | 6/1989 |
| JP | 02002698 A | 1/1990 |
| JP | 02-16018 | 2/1990 |
| JP | 02-130990 | 5/1990 |
| JP | 03-034588 | 2/1991 |
| JP | 3274780 | 5/1991 |
| JP | 03-148189 A | 6/1991 |
| JP | 03-269416 | 12/1991 |
| JP | 3274780 | 12/1991 |
| JP | 04-011794 A | 1/1992 |
| JP | 04-344725 | 12/1992 |
| JP | 05-102582 | 4/1993 |
| JP | 05-110179 | 4/1993 |
| JP | 05-259561 A | 10/1993 |
| JP | 05-327093 | 12/1993 |
| JP | 06-021539 | 1/1994 |
| JP | 06-052575 | 2/1994 |
| JP | 07-103771 | 4/1995 |
| JP | 07-183597 A | 7/1995 |
| JP | 07-263786 A | 10/1995 |
| JP | 07263786 A2 | 10/1995 |
| JP | 08-014918 | 1/1996 |
| JP | 08-018139 | 1/1996 |
| JP | 08-043533 | 2/1996 |
| JP | 10-096610 A | 4/1998 |
| JP | 2004-088120 | 3/2004 |
| WO | WO 82/03456 A1 | 10/1982 |
| WO | 94/19847 A | 9/1994 |
| WO | WO 94/19847 | 9/1994 |
| WO | 9522429 A | 8/1995 |

OTHER PUBLICATIONS

"Imaging Objects Hidden in Highly Scattering Media Using Femtosecond Second-Harmonic-Generation Cross-Correlation Time Gating", Yoo et al., Optics Letters, Jul. 1, 1991, vol. 16, No. 13, pp. 1019-1021.

"Femtosecond Transillumination Optical Coherence Tomography", Hee et al., Optics Letters, vol. 18, No. 12, Jun. 15, 1993, pp. 950-952.

"Imaging With Short Optical Pulses", Diels et al., Optics and Lasers in Engineering 4, (1983) 145-165.

"Imaging With Femtosecond Pulses", Yan et al., Applied Optics, Nov. 10, 1992, vol. 31 No. 32, pp. 6869-6873.

"Femtosecond Optical Ranging in Biological Systems", Fujimoto et al., Optics Letters, vol. 11 No. 3, Mar. 1986, pp. 150-152.

"Ultrashort Light Pulses, Picosecond Techniques and Applications", Ippen, E.P. and Shank, C.V., Springer-Verlag, Berlin, Heidelberg, New York, 1977.

"Measurement of Picosecond Laser Pulse Widths", Armstrong, Applied Physics Letters, Jan. 1, 1967, vol. 10, No. 1, pp. 16-19.

"Intense Light Bursts in the Stimulated Raman Effect", Maier et al., Physical Review Letters, Dec. 26, 1966, vol. 17, No. 26, pp. 1275-1277.

"Dynamic Stectroscopy and Subpicosecond Pulse Compression", Ippen et al., Applied Physics Letters, vol. 27, No. 9, Nov. 1975, pp. 488-490.

"CW Autocorrelation Measurements of Picosecond Laser Pulses", Sala et al., IEEE Journal of Quantum Electronics, vol. QE-16, No. 9, Sep. 1980, pp. 990-996.

Subpicosecond-Time-Domain Reflectometry, Fontaine et al., Optics Letters, vol. 6, No. 9, Sep. 1981, pp. 405-407.

"400-Hz Mechanical Scanning Optical Delay Line", Kwong et al., Optics Letters, vol. 18, No. 7, Apr. 1, 1993, pp. 558-560.

"In Vivo Retinal Imaging by Optical Coherence Tomography", Swanson et al., Optics Letters, vol. 18, No. 21, Nov. 1, 1993, pp. 1864-1866.

"Optical Mechanical, and Thermal Properties of Barium Borate", Eimerl et al., J. Appl. Physics, vol. 62, No. 5, Sep. 1, 1987, pp. 1968-1983.

"Ultrafast Diagnostics", Diels et al., Revue Phys. Appl. 22, Dec. 1987, pp. 1605-1611.

"Control and Measurement of Ultrashort Pulse Shapes (in Amplitude and Phase) With Femtosecond Accuracy", Diels et al., Applied Optics, vol. 24, No. 9, May 1, 1985, pp. 1270-1282.

"Measurement of Ultrashort Optical Pulses With $\beta$-$BaB_2O_4$", Cheng et al., Dec. 7, 1987.

"Ultrafast Near-Field Optical Probing", Stark et al., Ultrafast Electronics and Optoelectronics, OSA Tech Digest Series, vol. 13, Mar. 13, 1995, pp. 169-171.

"Picosecond Photoconductive Sampling With Nanosecond Carrier Lifetimes Using an Integrated Inductive Loop", Davidson et al., Ultrafast Electronics and Optoelectronics, OSA Tech Digest Series, vol. 13, Mar. 13, 1995, pp. 156-161.

"Optoelectronic Characterization of Resonant Tunneling Diodes", Nagatsuma et al., Ultrafast Electronics and Optoelectronics, OSA Tech Digest Series, vol. 13, Mar. 13, 1995, pp. 61-63.

"Electro-Optic Testing of Ultrafast Electronic and Optoelectronic Devices", Nagatsuma, Ultrafast Electronics and Optoelectronics, OSA Tech Digest Series, vol. 13, Mar. 13, 1995, pp. 46-48.

"All-Optical Signal Processing Technology in 100 Gbit/s Optical TDM Transmission", Saruwatari, Ultrafast Electronics and Optoelectronics, OSA Tech Digest Series, vol. 13, Mar. 13, 1995, pp. 36-38.

"Coherent Charge Oscillations in Bulk GaAs", Smirl et al., Ultrafast Electronics and Optoelectronics, OSA Tech Digest Series, vol. 13, Mar. 13, 1995, pp. 17-19.

"Terahertz Spectroscopy of Optically Thick Multilayered Semiconductor Structures", Ralph et al., J. Opt. Soc. Am. B/vol. 11, No. 12, Dec. 1994, pp. 2528-2532.

"Design of Multimirror Structures for High-Frequency Bursts and Codes of Ultrashort Pulses", Narayan et al., IEEE Journal of Quantum Electronics, vol. 30, No. 7, Jul. 1994, pp. 1671-1680.

"All-Fiber Femtosecond Pulse Amplification Circuit Using Chirped Bragg Gratings", Galvanauskas, Appl. Phys. Lett. 66 (9), Feb. 27, 1995, pp. 1053-1055.

"Noise of Mode-Locked Lasers", Haus et al., IEEE Journal of Quantum Electronics, vol. 29, No. 3, Mar. 1993, pp. 983-996.

"Environmentally Stable Kerr-Type Mode-Locked Erbium Fiber Laser Producing 360-FS Pulses", Fermann, Jan. 1, 1994, vol. 19, No. 1, Optics Letters, pp. 43-45.

"Femtosecond Optical Ranging in Biological Systems", Fujimoto et al., Optics Letters, vol. 11, No. 3, Mar. 1986, pp. 150-152.

"Time Synchronization Measurements Between Two Self-Modelocked Ti:Sapphire Lasers", Spence et al., Optics Communications, vol. 101, Nos. 3 and 4, Aug. 15, 1993, pp. 286-296.

"Compact Optical Pulse Train Generator", Belting, Applied Optics, vol. 31, No. 15, May 20, 1992, pp. 2642-2644.

"Mode-Locked Laser Pulse Train Repetition Frequency Multiplication: The Optical Rattler", MacFarlane et al., Applied Optics, vol. 30, No. 9, Mar. 20, 1991, pp. 1042-1047.

"Imaging With Terahertz Waves", Hu et al., Optics Letters, vol. 20, No. 16, Aug. 15, 1995, pp. 1716-1719.

Newport Corp. Model #PX-D7, manufactured by Picometrix, Newport 1994 Catalog, pp. 13.34-13.37.

"Rapid Programmable 300 ps Optical Delay Scanner and Signal-Averaging System for Ultrafast Measurements", Edelstein et al., Rev. Sci. Instrum., vol. 62, No. 3, Mar. 1991, pp. 579-583.

"Timing Synchronization of a Passively Mode-Locked Dye Laser Using a Pulsed Optical Phase Lock Loop", Dijaili et al., Applied Physics Letter, vol. 55, No. 5, Jul. 31, 1989, pp. 418-420.

"Programmable Ultrashort Optical Pulse Delay Using an Acousto-Optic Deflector", Piyaket et al., Applied Optics, vol. 34, No. 8, Mar. 10, 1995, pp. 1445-1453.

"Controllable Dual-Wavelength Operation of a Femtosecond Neodynium Fiber Laser", Ober et al., Optics Letters, vol. 20, No. 2, Jan. 15, 1995, pp. 195-197.

"Ultra-High-Speed PLL-Type Clock Recovery Circuit Based on All-Optical Gain Modulation in Traveling-Wave Laser Diode Amplifier", Kawanishi et al., Journal of Lightwave Technology, vol. 11, No. 12, Dec. 1993, pp. 2123-2129.

"Two-Color Synchronously Mode-Locked Femtosecond Ti:Sapphire Laser", Barros et al., Optics Letters, vol. 18, No. 8, Apr. 15, 1993, pp. 631-633.

"Dual-Wavelength Self-Mode-Locked Ti:Sapphire Laser", Evans et al., Optics Letters, vol. 18, No. 13, Jul. 1, 1993, pp. 1074-1076.

"Sticky Pulses: Two-Color Cross-Mode-Locked Femtosecond Operation of a Single Ti:Sapphire Laser", Dykaar et al., Optics Letters, vol. 18, No. 8, Apr. 15, 1993, pp. 634-636.

"Dual-Wavelength Synchronous Operation of a Mode-Locked Ti:Sapphire Laser Based on Self-Spectrum Splitting", Zhang et al., Optics Letters, vol. 18, No. 24, Dec. 15, 1993, pp. 2126-2128.

"Ultrahigh-Speed Phaselocked-Loop-Type Clock Recovery Circuit Using a Traveling-Wave Laser Diode Amplifier as a 50 GHz Phase Detector", Kawanishi et al., pp. 1-3.

"Picosecond Measurements by Free-Running Electro-Optic Sampling", Giboney et al., IEEE Photonics Technology Letters, vol. 6, No. 11, Nov. 1994, pp. 1353-1355.

"Subpicosecond Laser Timing Stabilization", Rodwell et al., IEEE Journal of Quantum Electronics, vol. 25, No. 4, Apr. 1989, pp. 817-827.

"Scanning Femtosecond Optical Delay With 1000x Pulse Width Excursion", Chu et al., Conference on Lasers and Electro-Optics, OSA Tech. Digest Series, vol. 8, 1994, paper CTh123, pp. 333.

"Two-Color Subpicosecond Optical Sampling Technique", Kafka et al., Optics Letters, vol. 17, No. 18, Sep. 15, 1992, pp. 1286-1288.

"Actively Modelocked Dual-Wavelength Fiber Laser With Ultra-Low Inter-Pulse-Stream Timing Jitter", Pattison et al., IEEE Photonics Technology Letters, vol. 7, Dec. 1995, pp. 1415-1417.

EP partial search report on European Patent dated Aug. 7, 2006 on Application 05025290.7 (IM139EP).

EP extended search report on European Patent dated Nov. 24, 2006 on Application 05025290.7 (IM139EP).

European Patent Office Communication dated Jul. 27, 2007 on Application 05025290.7 (IM139EP).

European Patent Office Communication dated Nov. 12, 2008 on Application 05025290.7 (IM139EP).

European Patent Office Communication dated Dec. 19, 2011 on Application 05025290.7 (IM139EP).

European Patent Office Communication dated Mar. 29, 2012 on Application 05025290.7 (IM139EP).

Kafka et al., Two-Color Subpicosecond Optical Sampling Technique, Kafka, Optics Letters, vol. 17, No. 18, Sep. 15, 1992, pp. 1286-1288. (3 pages).

* cited by examiner

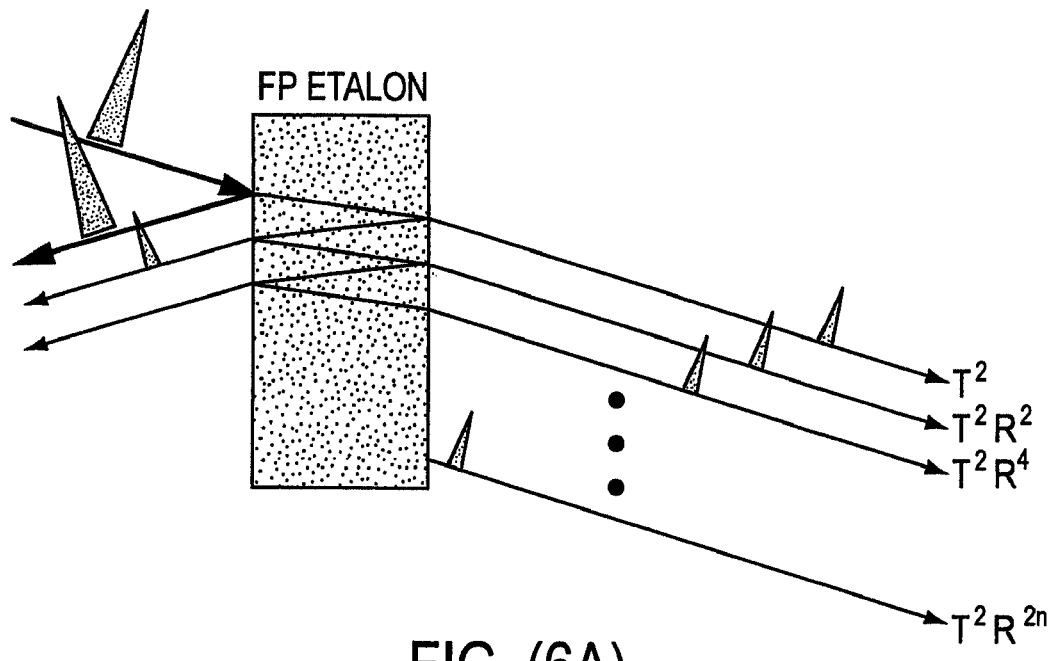
FIG. (6A)
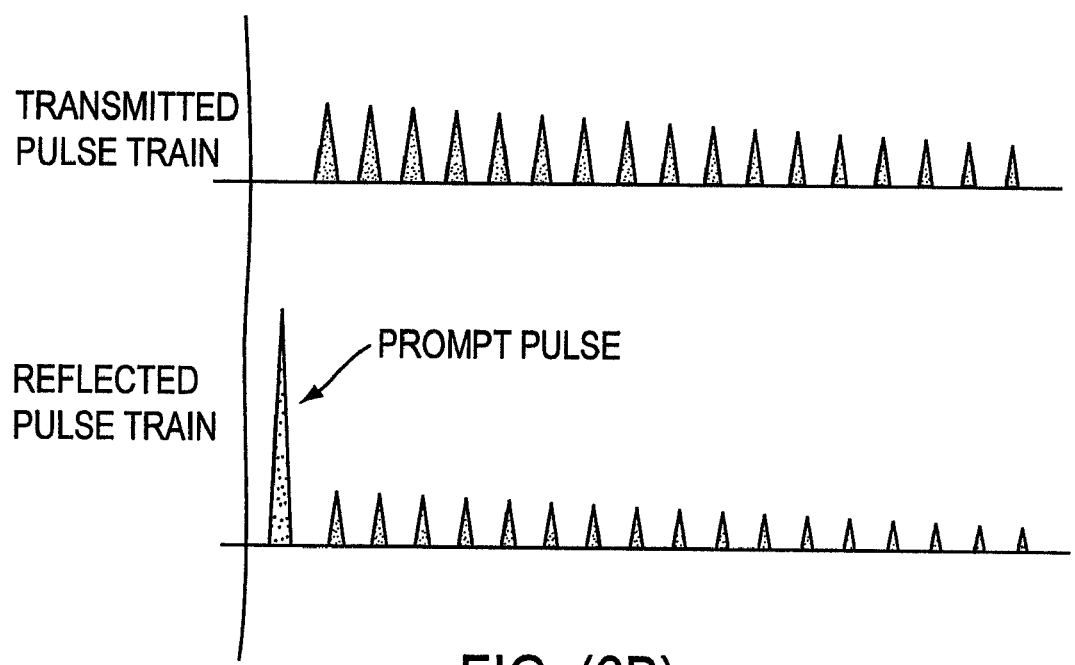
FIG. (6B)

SCANNING TEMPORAL ULTRAFAST DELAY AND METHODS AND APPARATUSES THEREFOR

This is a continuation of application Ser. No. 10/050,716 filed Jan. 18, 2002 now U.S. Pat. No. 7,580,432, which is a Divisional Application of application Ser. No. 08/602,457, filed Feb. 16, 1996 now U.S. Pat. No. 5,778,016, which is a Continuation-In-Part of application Ser. No. 08/221,516, filed on Apr. 1, 1994 now U.S. Pat. No. 5,585,913. The entire disclosures of the prior application, application Ser. No. 10/050,716 is hereby incorporated by reference.

BACKGROUND OF THE INVENTION

1. Field of the Invention

This invention is related to the field of ultra-short pulsewidth lasers, and particularly to apparatuses and methods for performing temporal scanning with minimal (i.e., micronscale) mechanical movement. The invention also relates to methods used for obtaining high-accuracy (i.e., sub-picosecond) timing calibration, applicable to the above-mentioned temporal scanning methods or to conventional temporal scanning methods. In particular, the invention eliminates the need for a mechanical scanning delay arm in a correlator or other type of pump-probe device, including ranging, 3-D imaging, contouring, tomography, and optical time-domain reflectometry (OTDR).

2. Description of the Related Art

Ultrafast laser oscillators are presently known which are capable of generating pulsewidths of the order of tens of femtoseconds with nanojoule-level pulse energies, at repetition rates ranging from 5 MHz to as high as 1 GHz. Such short pulses are used for many applications including measurements by time gating, including metrology. Many applications of such short optical pulses require that one set of optical pulses be delayed with respect to another set of optical pulses, in which temporal delays must be known to a very high accuracy, such as on the order of 10 femtoseconds. Temporal delays for short pulses find many uses in such applications as biological and medical imaging, fast photodetection and optical sampling, optical time domain reflectometers, and metrology.

The conventional method for delaying and scanning optical pulses is to reflect the pulses from a mirror and to physically move the mirror, using some mechanical means, by a distance D, which is defined by the product of the time delay, $\Delta T$, and the speed of light in vacuum $c = 30 \times 10^8$ meters/sec. Thus:

$$D = c/2 \times \Delta T \text{ or } D \text{ (cm)} = 15 \times \Delta T \text{ (nsec)}.$$

This type of delay will be termed here a physical delay. Also, scanning, as that term is used here, refers to the systematic changing of the difference in time of arrival between two optical pulses. Various methods and devices have been developed to provide the accurate positioning and scanning of the mirror, involving:

- Voice-coil type devices (shakers) (R. F. Fork Nd F. A. Beisser, *APPL Opt.* 17, 3534 (1978)).
- Rotating mirror pairs (Z. A. Yasa and N. M. Amer, *Opt. Comm.*, 36, 406 (1981)).
- Linear translators employing stepper motors, which are commercially available from many vendors.
- Linear translators employing galvanometers. (D. C. Edelstein, R. B. Romney, and M. Scheuermann, *Rev. Sci, Instrum.* 62, 579 (1990)).

Other types of physical delays use adjustable group delay including:

- Femtosecond pulse shapers (FPS) employing scanning galvanometers (K. F. Kwong, D. Yankelevich, K. C. Chu, J. P. Heritage, and A. Dienes; "400-Hz mechanical scanning optical delay line" *Opt. Lett.* 18, (7) 558 (1993) (hereinafter Kwong et al.); K. C. Chu, K. Liu, J. P. Heritage, A. Dienes, *Conference on Lasers and Electro-Optics, OSA Tech. Digest Series*, Vol. 8, 1994, paper CThI23.).
- Rotating glass blocks.

The physical delay methods suffer from a number of disadvantages, the chief one being the large space required if large delays are desired. For example, a delay of 10 nsec requires a mirror displacement of 5 feet. There are other physical limitations and disadvantages as well. Misalignment and defocusing can distort measurements when large delays are used. Using corner-cube retroreflectors reduces the problem of misalignment, but not defocusing. The defocusing effect can occur when the scan amplitude is an appreciable fraction of the confocal parameter of the beam. A time delay of 10 nsec entails a change in free-space propagation of 10 feet (~3 meters). Thus, to minimize the effects of defocusing, the confocal parameter ($Z_R$) must be approximately 10-times this number or $Z_R = 30$ meters. At a wavelength of 1550 nm, this requires a beam radius of $w_o = 12$ mm. This is impracticably large for many situations.

The need for large mirror displacement can be reduced by multi-passing the delay line (e.g., double-passing the delay line cuts the required mirror displacement in half), however, this does not alleviate the defocusing problem. Multipassing causes its own set of problems in that alignment procedures are more complicated, and the optical losses are increased.

Yet another limitation has to do with the scanning rates and scanning frequencies which can be achieved simultaneously. It is often desirable to signal average while scanning rapidly (>30 Hz) in order to provide "real-time" displays of the measurement in progress. However, the scanning range is limited at such high scan frequencies. The best achieved scan range is 100 psec at a rate of 100 Hz using the scanning FPS method (Kwong et al.). Any further increase of the scanning range and/or frequency with such reciprocating devices would cause high levels of vibration, which can be disruptive to laser operation. Rotating glass blocks avert the vibration problem, and are capable of higher scan speed, but lack any adjustability of scan range, and they introduce variable group velocity dispersion which makes them inappropriate for use with pulses having widths shorter than 100 fsec.

In addition to the physical delays, methods have been introduced which provide temporal scanning without the need for any mechanical motion. These include:

- Free-scanning lasers (A. Black, R. B. Apte, and D. M. Bloom, *Rev. Sci, Instrum.* 63, 3191 (1992); K. S. Giboney, S. T. Allen, M. J. W. Redwell, and J. E. Bowers; "Picosecond Measurements by Free-Running Electro-Optic Sampling." *IEEE Photon. Tech. Lett.*, 6, pp. 1353-5, November 1994; J. D. Kafka, J. W. Pieterse, and M. L. Watts; "Two-color subpicosecond optical sampling technique." *Opt. Lett.*, 17, pp. 1286-9, Sep. 15, 1992 (hereinafter Kafka et al.); M. H. Ober, G. Sucha, and M. E. Fermann; "Controllable dual-wavelength operation of a femtosecond neodymium fiber laser," *Opt. Lett.* 20, pp. 195-7, Jan. 15, 1995).
- Stepped mirror delay lines employing acousto-optic deflectors as the dispersive elements (R. Payaket, S. Hunter, J. E. Ford, S Esener; "Programmable ultrashort optical pulse delay using an acousto-optic deflector." *Appl. Opt.*, 34, no. 8, pp. 1445-1453, Mar. 10, 1995).

Slewing of RF phase between two modelocked lasers (D. E. Spence, W. E. Sleat, J. M. Evans, W. Sibbett, and J. D. Kafka; "Time synchronization measurements between two self-modelocked Ti:sapphire lasers." *Opt. Comm.*, 101, pp. 286-296, Aug. 15, 1993).

The non-mechanical methods, in particular, are capable of high speed scanning. The free-scanning lasers produce a scan range which spans the entire repetition period of the laser. For example, a known free-scanning laser system is shown in FIG. 1, which includes a master laser 10 and a slave laser 20 having different cavity lengths which produce pulse trains at different repetition frequencies $v_1$ and $v_2$. The scan frequency is equal to the frequency difference $\Delta v = v_1 - v_2$, and is set at the desired value by adjusting the cavity length of the slave laser to a specific fixed length. A correlator 40 produces a signal from the cross-correlation between the two lasers which gives information about the timing between the two lasers, and provides triggering signal to data acquisition electronics 50. For example, in Kafka et al. two independent, mode-locked Ti:sapphire lasers, namely, master laser 10 and slave laser 20 each with a nominal repetition rate of 80 MHz, were set to have different repetition frequencies (by about 80 Hz). Due to the offset in repetition frequency, the lasers scanned through each other at an offset frequency $\Delta v$ of approximately 100 kHz. This offset frequency can be stabilized to a local RF oscillator. Since the laser repetition rates were near 80 MHz, the total scan range was about 13 nsec. Thus, time scanning was achieved without employing any moving mechanical delay lines. Timing calibration was achieved by cross-correlating the two laser beams, reflected off of a mirror 30, in a nonlinear crystal, i.e., correlator 40, the resulting signal being used to trigger data acquisition unit 50 (e.g. an oscilloscope). The laser beams output from lasers 10 and 20 are also reflected off another mirror 60 and received by a measurement apparatus 70 which performs a desired measurement or experiment using the laser beams.

The chief drawback to this technique is that it is highly wasteful of data acquisition time for two main reasons:
1. Fixed scan range—The scan range is fixed at the inverse of the repetition frequency (i.e., the round trip time) of the laser.
2. Dead time—One is often interested in only a 100 psec, or 10 psec scan range instead of the full 13 nsec pulse spacing. Thus, only 1% (or 0.1%) of the 10 μsec scan time is useful, while the remaining 99% (99.9%) is "dead-time." This increases data acquisition time by a factor of 100 or 1000.

Kafka et al. address these limitations and suggest that this can be partially circumvented by using lasers with higher repetition rates, (e.g., $v_o = 1$ GHz). However, this solution is unacceptable for many applications which require a large variety of scan ranges. For example, pump-probe measurements of semiconductors are frequently conducted over a large variety of time ranges. Lifetimes of carriers (i.e., electrons and holes) of the semiconductor are on the order of several nanoseconds which makes a 1 GHz laser completely unacceptable, since residual carriers from the previous laser pulse would still be present when the next pulse arrives. Yet at the same time, it is often desirable to zoom-in on a much narrower time scale (e.g., 50 psec) to look at extremely fast dynamics. Thus, the free-scanning laser technique lacks the versatility of scan range selection which is required in many applications. The way to get a large temporal dynamic range without having extremely long acquisition times is to have the flexibility of a coarse and fine timing adjustment.

In related work, several methods have been used to stabilize the timing between two modelocked lasers, in cases where the lasers were actively mode locked, passively modelocked, and regeneratively modelocked, or with combinations of passively and actively mode-locked lasers. The methods used for synchronization can be divided into two main types: (1) passive optical methods; (2) electronic stabilization. The highest synchronization accuracy is achieved by passive optical methods in which the two lasers interact via optical effects (J. M. Evans, D. E. Spence, D. Burns, and W. Sibbett; "Dual-wavelength selfmode-locked Ti:sapphire lasers." *Opt. Lett.*, 13, pp. 1074-7, Jul. 1, 1993; M. R. X. de Barros and P. C. Becker; "Two-color synchronously mode-locked femtosecond Ti:sapphire laser." *Opt. Lett.*, 18, pp. 631-3, Apr. 15, 1993; D. R. Dykaar, and S. B. Darak, "Sticky pulses: two-color cross-mode-locked femtosecond operation of a single Ti:sapphire laser," *Opt. Lett.*, 18, pp. 634-7, Apr. 15, 1993 (hereinafter Dykaar et al.); Z. Zhang and T. Yagi, "Dual-wavelength synchronous operation of a mode-locked Ti:sapphire laser based on self-spectrum splitting." *Opt. Lett.*, 18, pp. 2126-8, Dec. 15, 1993). These optical effects, (e.g., cross-phase modulation) cause a rigid locking effect between the two lasers which become synchronized to within less than one pulse width (<100 fsec). Although these give the most accurate synchronization, the time delay between the lasers is rigidly fixed; so that in order to scan the time delay between them, one must use the conventional physical scanning delay methods.

Electronic stabilization using simple RF phase detection gives the most flexibility in terms of adjusting the relative time delay, but at the present time these systems can maintain timing accuracy of no better than a few picoseconds (~3 psec). Such a system is commercially available for stabilizing a Ti:sapphire laser to an external frequency reference, or for synchronizing two mode-locked Ti:sapphire lasers. (Spectra Physics Lok-to-Clock™ system). Stabilization of better than 100 fsec has been achieved by use of a pulsed optical phase locked loop (POPLL). This is a hybrid opto-electronic method, as disclosed in S. P. Dijaili, J. S. Smith, and A. Dienes, "Timing synchronization of a passively mode-locked dye laser using a pulsed optical phase locked loop." *Appl Phys. Lett.*, 55, pp. 418-420, July 1989 (hereinafter Dijaili et al.), in which the electronic stabilizer circuit derives the timing error signal from an optical cross-correlator. However, this method suffers from the same lack of timing adjustability as the passive optical methods. The timing can only be adjusted by less than one pulse width. Thus, using the POPLL method, it would be necessary to insert some sort of physical delay line into one laser beam if it were desired to change the relative pulse timing by anything more than one pulsewidth.

The performance of timing stabilization by RF methods could improve if the intrinsic timing jitter of the laser can be reduced. Some reduction of intrinsic laser jitter can be achieved by insuring that the two lasers are exposed to identical environmental conditions as much as possible. The Sticky-Pulse laser, which is disclosed by Dykaar et al., employs a spatially split pump laser beam to pump two spatially separate regions of a Ti:sapphire laser crystal. This is essentially two separate lasers which share the same pump laser, laser crystal, air space, and most other intracavity elements except for the two end mirrors. In this way, the two lasers experience the same thermal fluctuations, pump laser noise, and turbulence, thus minimizing the difference in repetition rate jitter. This allows even a weak optical interaction between the two lasers to lock the pulses together. This general principle of "environmental coupling" can be applied to other types of lasers including mode-locked fiber lasers.

However, it should be noted the object of Dykarr et al. is to lock the two lasers together, which is undesirable for the purposes of the present invention, because then the time delay cannot be scanned; i.e., the timing of the pulses from the two coupled lasers of the Sticky-Pulse laser discussed above, are locked together through the optical coupling and they cannot be independently controlled.

SUMMARY OF THE INVENTION

It is an object of the present invention to provide a method and apparatus for rapidly scanning the time delay between two modelocked lasers, e.g., "master" and "slave" lasers, without the need for large mechanical movements of optical elements, which would allow scanning of any selected, contiguous subinterval of the pulse repetition period $T_R$. This is accomplished by making appropriate adjustments, on the order of microns, to the cavity length of one laser (e.g., the slave laser), while using an electronic feedback circuit to continually monitor the average timing (phase) between the two lasers. Additionally, it is desired to modify the RF stabilization of the two lasers in such a way that, unlike the free-scanning laser method, the relative time delay can be scanned over some sub-interval of the repetition period, thus greatly improving the duty cycle of data acquisition.

It is another object of the present invention to minimize the timing jitter caused by fluctuations in environmental conditions, such as vibration, air turbulence, and varying temperature. This is accomplished by constructing both lasers with identical elements within the same enclosure, and pumping them with the same pump laser, yet allowing them to be independently controlled. In particular, in the case of fiber lasers, it can be accomplished by co-wrapping the fibers together on the same spool.

It is yet another object of the present invention to provide methods for calibrating the scanning time scale with subpicosecond accuracy, to be used during and in conjunction with the scanning method mentioned above. For example, the present invention can be used to cross-correlate the pulses from one laser (e.g., a master laser) with pulse sequences obtained by passing pulses from the other laser (e.g. a slave laser) through a series of partially reflective optical elements.

BRIEF DESCRIPTION OF THE DRAWINGS

The above and other objects and advantages of the invention will becomes more apparent and more readily appreciated from the following detailed description of the presently preferred embodiments of the invention taken in conjunction with the accompanying drawings, of which:

FIGS. 6(A) and (B) show a high-finesse Fabry-Perot etalon producing pulse trains;

DETAILED DESCRIPTION OF THE PREFERRED EMBODIMENTS

Figure 1:
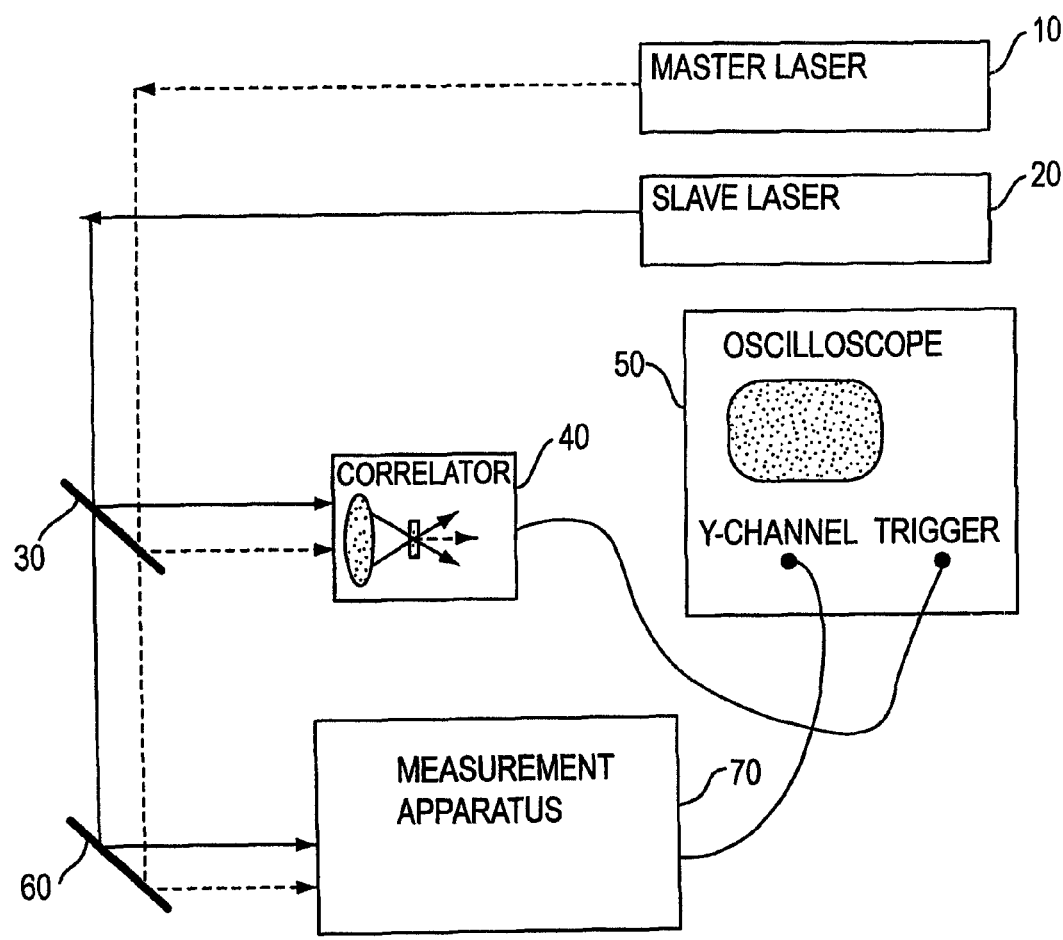
FIG. 1 shows a known free-scanning laser system.

The embodiments of the present invention are described below in more detail with reference to the above drawings, in which like reference numerals refer to the same or similar elements.

Principle of Fast Scanning Method

Figure 2A:
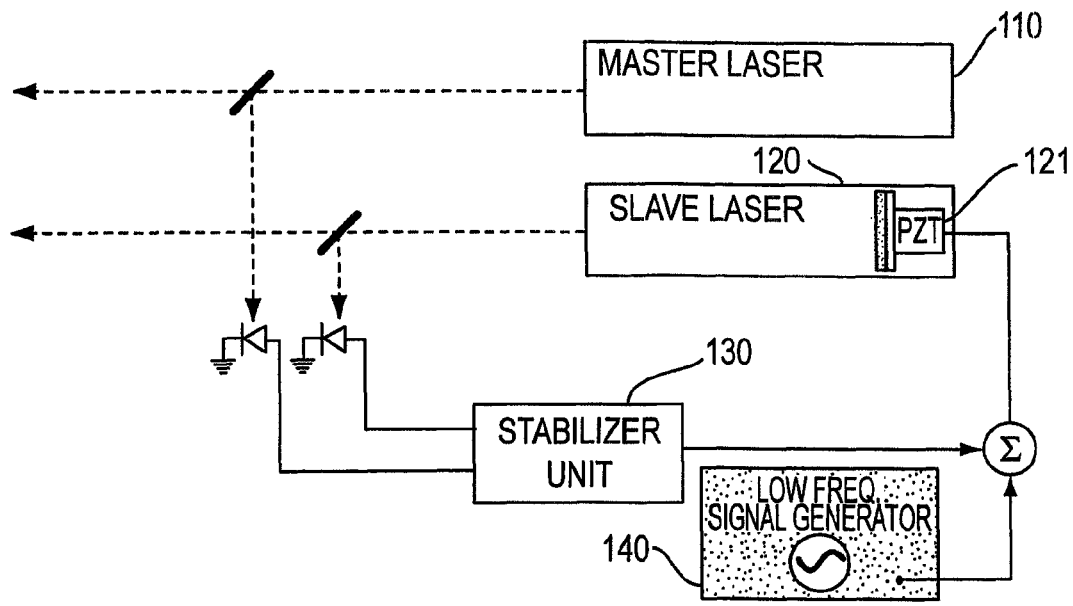
FIGS. 2(A) and (B) show a fast scanning laser system according to the present invention, in which the cavity length of one or both of the master and slave lasers is controlled.

The present invention, like the free-scanning laser system, consists of two lasers, a master laser 110 and a slave laser 120, which have nearly identical repetition rates as shown, for example, in FIG. 2(A). However, unlike the free-scanning laser system, pulses output from the master and slave lasers are not allowed to totally scan through each other. Rather, while master laser 110, which has a wavelength λ1, is held at a constant repetition rate $v_1$ or is allowed to drift of its own accord, the repetition frequency $v_2$ of slave laser 120 is dithered about the repetition rate of master laser 110. This dithering of the repetition rate is accomplished by changing the cavity length ($L_2$) of slave laser 120 at a "high" frequency, for example, in the range of 30 Hz to 1 kHz, while its average repetition rate is slaved, or controlled, to that of master laser 110 by a stabilizer unit 130 which includes a "slow" phase locked loop (PLL) circuit whose bandwidth is less than the scan frequency. The average timing delay between the master and slave lasers is held constant by stabilizer unit 130 which controls the cavity length of slave laser 120. Meanwhile, a fast dithering signal output from a signal generator 140 is summed with the control voltage output from stabilizer unit 130 to scan the instantaneous delay between the lasers. The slaving and dithering of the repetition frequency can be implemented by mounting an end mirror of slave laser 120 on a piezoelectric transducer (PZT) 121 and applying the requisite voltage signal from a frequency signal generator 140. It is required that the PLL circuit bandwidth be less than the dithering frequency; otherwise, it will try to track the master laser and counteract the cavity length scanning.

Figure 2B:
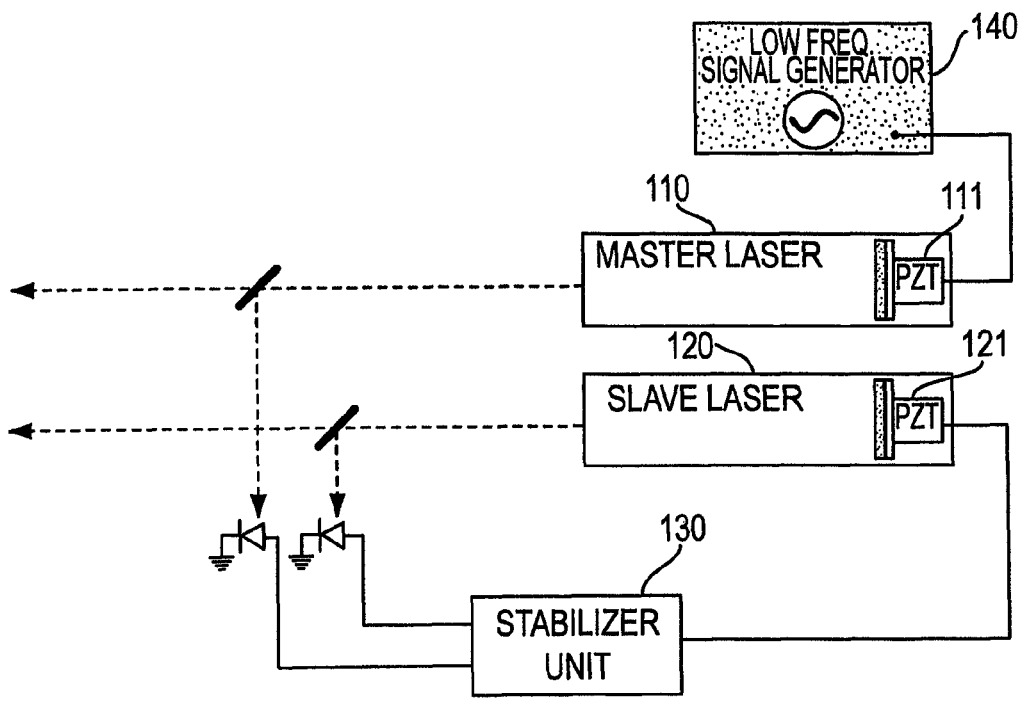

FIG. 2(B) shows another embodiment in which master laser 110 includes a PZT 111, and both the master and slave lasers 110 and 120 have mirrors controlled by PZTs 111 and 121. In this case, master laser 110 is dithered at the scan frequency while slave laser 120 tracks the average repetition rate of master laser 110. The cavity length of master laser 110 is dithered rapidly by signal generator 140 while the stabilizer locks slave laser 120 to the desired average time delay.

Again, it is necessary for the dithering frequency to exceed the bandwidth of the PLL circuit in order that the PLL not counteract the time scanning.

As an example of how the cavity length scanning operates, a square wave is applied to slave laser PZT 121 at a scanning frequency of $f_s$. Then the cavity length mismatch is a rapidly varying function of time:

$$\Delta L(t) = \Delta L_0 \cdot Sq(f_s t) \quad \text{Eq. 1}$$

where $\Delta L_0$ is the amplitude of the square wave displacement, and $Sq(x)$ is the square wave function. This would give positive and negative linear scanning delays for one half of the scan cycle (a triangle wave). In the time stationary case, a constant cavity length mismatch of $\Delta L$ produces an offset frequency of:

$$\Delta v = -\frac{c \Delta L}{2L^2} \quad \text{Eq. 2a}$$

which can be rewritten as $$\frac{\Delta v}{v} = -\frac{\Delta L}{L}. \quad \text{Eq. 2b}$$

However, in the fast scanning method, the cavity length is dithered at a frequency high enough so that the pulses never have a chance to completely walk through each other. That is, the scan frequency and amplitude satisfy the condition $$f_s \gg \Delta v \quad \text{Eq. 3}$$

or $$f_s \gg \frac{c \Delta L}{2L^2}$$

Figure 3A:
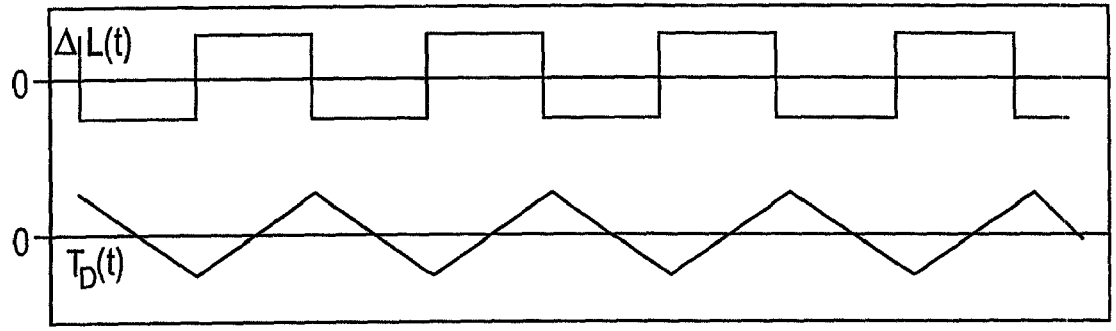
FIGS. 3(A) and (B) show time delay $T_D(t)$ and waveforms applied to the PZT in the laser cavity.

In this case, the time-varying time delay $T_d(t)$ would be proportional to the time integral of the cavity length mismatch:

$$T_d(t) = \frac{2}{cT_1} \int_0^\tau \Delta L(t') dt' \quad \text{Eq. 4}$$

or $$T_d(t) = \frac{1}{L} \int_0^\tau \Delta L(t') dt'$$

where c is the speed of light in vacuum, and the period of integration is on the order of one scan cycle. FIG. 3(A) shows an instance of square-wave modulation, in which a 1 kHz square wave is applied to the PZT in one of the lasers. The waveforms shown in FIG. 3 show a time-dependent cavity length mismatch, $\Delta L(t)$, and the resulting instantaneous time delay, $T_D(t)$, as a function of time when various dithering waveforms are applied to the PZT in the slave laser. The instantaneous repetition-rate $v_2$ dithers around $v_1$, and the relative time delay scans back and forth linearly in time. The total scan range is dependent on the base repetition rate $v_1$ the scan frequency $f_s$, and the scan amplitude $\Delta L$, according to the equations:

$$T_{max} = \frac{\Delta L}{2L} \cdot \frac{1}{f_s} \quad \text{Eq. 5a}$$

or, in terms of the offset frequency:

$$T_{max} = \frac{1}{2} \frac{\Delta v}{v} \cdot \frac{1}{f_s} \quad \text{Eq. 5b}$$

The scan rate, in units of (msec/msec) is given by:

$$R_{scan} = 2\Delta Lv/c \quad \text{Eq. 6a}$$

or $$R_{scan} = \frac{\Delta L}{L}$$

or, in more convenient laboratory units:

$$R_{scan} = 10^9 \frac{\Delta L}{L} \text{ (psec/msec)}. \quad \text{Eq. 6b}$$

The "sampling grid" is given by the temporal pulse advance per round trip:

$$\delta t_g = 2\Delta L/c \quad \text{Eq. 7}$$

A scanning velocity parameter can be defined, which is the amount of spatial pulse advance per second. This is given by $$v_{scan}(t) = \frac{2\Delta L(t)}{T_R} = \frac{\Delta L(t)}{L} \cdot c. \quad \text{Eq. 8}$$

Note that these concepts of scan rate, sampling grid, and scan velocity apply equally well to free-scanning lasers.

As an example, a pair of lasers with a nominal cavity length of L=1.5 meters gives $v_1$=100 MHz. If a scan amplitude of $\Delta L$=15 μm is assumed, an offset frequency of $\Delta v$=1 kHz, a scan rate of $R_{scan}$=$10^4$ psec/msec, and a sampling grid of $\delta t_g$=100 fsec result. Full pulse walkoff occurs in 1 msec if the cavity length is not dithered. Thus, a scan frequency of $f_s$>1 kHz is required to prevent total walkoff if a 15 μm scan amplitude is used.

Tables 1, 2, and 3 show some possible scan ranges, scan rates, and sampling grid intervals as a function of various scan parameters, for modelocked lasers with repetition rates v of 10 MHz, 100 MHz, and 1 GHz. It can be seen from Table 3 that for a 1 GHz laser, most practical scan conditions produce total walkoff, hence, the time delay cannot exceed 1 nsec. Thus, for lasers with repetition rates under 1 GHz, the dithering method of the present invention is preferable to the free-scanning laser methods.

TABLE 1

Scan Parameters for a 10 MHz Laser (L = 15 m).

| Scan Freq. $f_s$ (Hz) | $\Delta L_0$ (μm) | Offset Freq. $\Delta v$ (Hz) | Scan rate (psec/msec) | Grid (fsec) | ScanVel. (m/sec) | Scan range (psec) |
|---|---|---|---|---|---|---|
| 10 | 0.15 | 1 | 10 | 1 | 3 | 50 |
| 10 | 1.50 | 10 | 100 | 10 | 30 | 500 |

TABLE 1-continued

Scan Parameters for a 10 MHz Laser (L = 15 m).

| Scan Freq. $f_s$ (Hz) | $\Delta L_0$ (μm) | Offset Freq. $\Delta v$ (Hz) | Scan rate (psec/msec) | Grid (fsec) | ScanVel. (m/sec) | Scan range (psec) |
|---|---|---|---|---|---|---|
| 10 | 15.00 | 100 | 1000 | 100 | 300 | 5000 |
| 100 | 0.15 | 1 | 10 | 1 | 3 | 5 |
| 100 | 1.50 | 10 | 100 | 10 | 30 | 50 |
| 100 | 15.00 | 100 | 1000 | 100 | 300 | 500 |
| 1000 | 0.15 | 1 | 10 | 1 | 3 | 0.5 |
| 1000 | 1.50 | 10 | 100 | 10 | 30 | 5 |
| 1000 | 15.00 | 100 | 1000 | 100 | 300 | 50 |

TABLE 2

Scan Parameters for a 100 Mhz Laser (L = 1.5 m).

| Scan Freq. $f_s$ (kHz) | $\Delta L_0$ (μm) | Offset Freq. $\Delta v$ (Hz) | Scan rate (psec/msec) | Grid (fsec) | ScanVel. (m/sec) | Scan range (psec) |
|---|---|---|---|---|---|---|
| 0.1 | 0.15 | 10 | 100 | 1 | 30 | 500 |
| 0.1 | 1.50 | 100 | 1000 | 10 | 300 | 5000 |
| 1.0 | 0.15 | 10 | 100 | 1 | 30 | 50 |
| 1.0 | 1.50 | 100 | 1000 | 10 | 300 | 500 |
| 1.0 | 15.00 | 1000 | 10,000 | 100 | 3000 | 5000 |
| 10.0 | 0.15 | 10 | 100 | 1 | 30 | 5 |
| 10.0 | 1.50 | 100 | 1000 | 10 | 300 | 50 |
| 10.0 | 15.00 | 1000 | 10,000 | 100 | 3000 | 500 |
| 100.0 | 1.50 | 100 | 1000 | 10 | 300 | 5 |
| 100.0 | 15.00 | 1000 | 10,000 | 100 | 3000 | 50 |

TABLE 3

Scan Parameters for a 1 Ghz Laser (L = .15 m).

| Scan Freq. $f_s$ (kHz) | $\Delta L_0$ (μm) | Offset Freq. $\Delta v$ (Hz) | Scan rate (psec/msec) | Grid (fsec) | ScanVel. (m/sec) | Scan range (psec) |
|---|---|---|---|---|---|---|
| 0.1 | 0.15 | 1 | 1000 | 1 | 300 | * |
| 0.1 | 1.50 | 10 | 10,000 | 10 | 3000 | * |
| 1 | 0.15 | 1 | 1000 | 1 | 300 | 500 |
| 1 | 1.50 | 10 | 10,000 | 10 | 3000 | * |
| 1 | 15.00 | 100 | 100,000 | 100 | 30,000 | * |
| 10 | 0.15 | 1 | 1000 | 1 | 300 | * |
| 10 | 1.50 | 10 | 10,000 | 10 | 3000 | 500 |
| 10 | 15.00 | 100 | 100,000 | 100 | 30,000 | * |
| 100 | 0.15 | 1 | 1000 | 1 | 300 | 5 |
| 100 | 1.50 | 10 | 10,000 | 10 | 3000 | 50 |
| 100 | 15.00 | 100 | 100,000 | 100 | 30,000 | 500 |

* Total walkoff (1 nsec maximum)

Figure 3B:
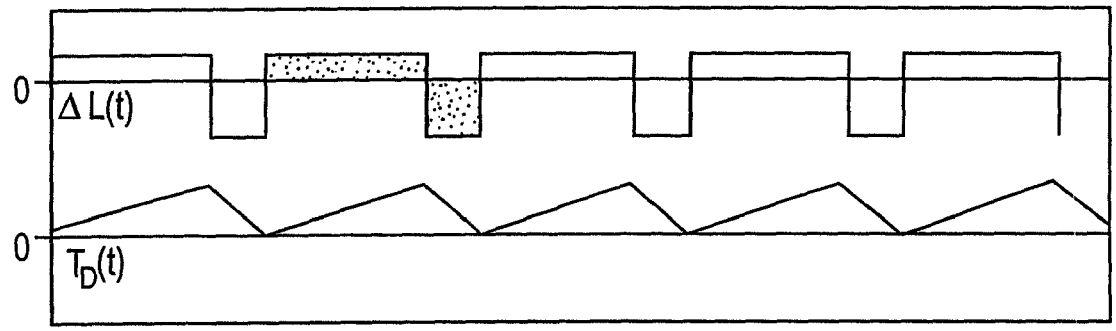

Symmetric square wave dithering is not the only desirable method. FIGS. 3(B) and (C) show two other dithering schemes in addition to the square wave modulation. An asymmetric type of rectangular wave can be used in order to obtain unidirectional scanning, as shown in FIG. 3(B). This would reduce the wasted dead-time of the backward scan. While unidirectional scanning is used in commercial Fabry-Perot interferometers, it is produced by a triangular waveform rather then by a rectangular waveform, as shown in FIG. 3B.

Figure 3C:
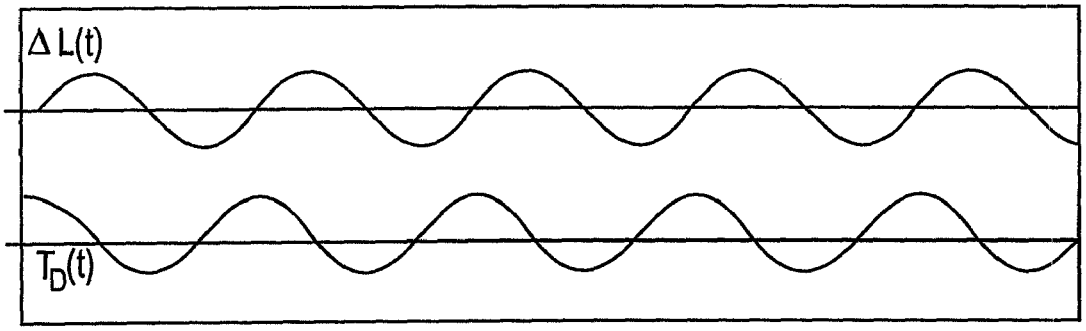

The abrupt voltage changes on the leading and falling edges of the rectangular and square waves can cause mechanical shock and ringing in the PZT, thus distorting the otherwise linear time scale of scanning. Some type of signal conditioning (e.g., smoothing of transitions) which would reduce these effects is desirable. Alternatively, a sinusoidal voltage can be applied to the PZT, as shown in FIG. 3(C). The advantage of sinusoidal scanning is that it avoids the shock and ringing which would accompany the sharp voltage transients associated with the square and rectangular waves. It also avoids timing distortion as the PLL tries to react to the induced cavity length mismatch. That is, for a simple analog stabilizer circuit, a sinusoidal drive voltage will produce a sinusoidal scanning characteristic, even if the stabilizer reacts somewhat to the scanning time delay. For these reasons, sinusoidal scanning is the simplest to implement. However, sinusoidal scanning does not share the advantage of a rectangular wave signal, such as that shown in FIG. 3B, which produces unidirectional scanning. Therefore, depending on the degree of simplicity required, a sinusoidal scanning signal can be desirable for driving the PZT.

The scan parameters given in Tables 1-3 were provided based on symmetric square wave modulation of the PZT. For sinusoidal scanning, the scan range and scan rate would be modified somewhat. The time-dependent delay is still given by equation 4, however, the cavity length modulation is given by:

$$\Delta L(t) = \Delta L_0 \cdot \cos(2\pi f_s t) \qquad \text{Eq. 9.}$$

Then the delay is:

$$T_D(t) = \frac{\Delta L_0}{L} \cdot \frac{1}{2\pi f_s} \cdot \sin(2\pi f_s t). \qquad \text{Eq. 10}$$

This will give sinusoidal scanning, although the time delay will be 90 degrees out of phase with the PZT position. Note that the scanning characteristic is not linear, and some type of scale correction is needed.

It should be noted that although the laser scanning technique described here was demonstrated using a pair of mode-locked fiber lasers, this technique is not limited to the embodiments described above, but is applicable to many types of mode-locked lasers including solid-state, diode lasers, and dye lasers.

Scanning Fiber Laser System

Figure 4:
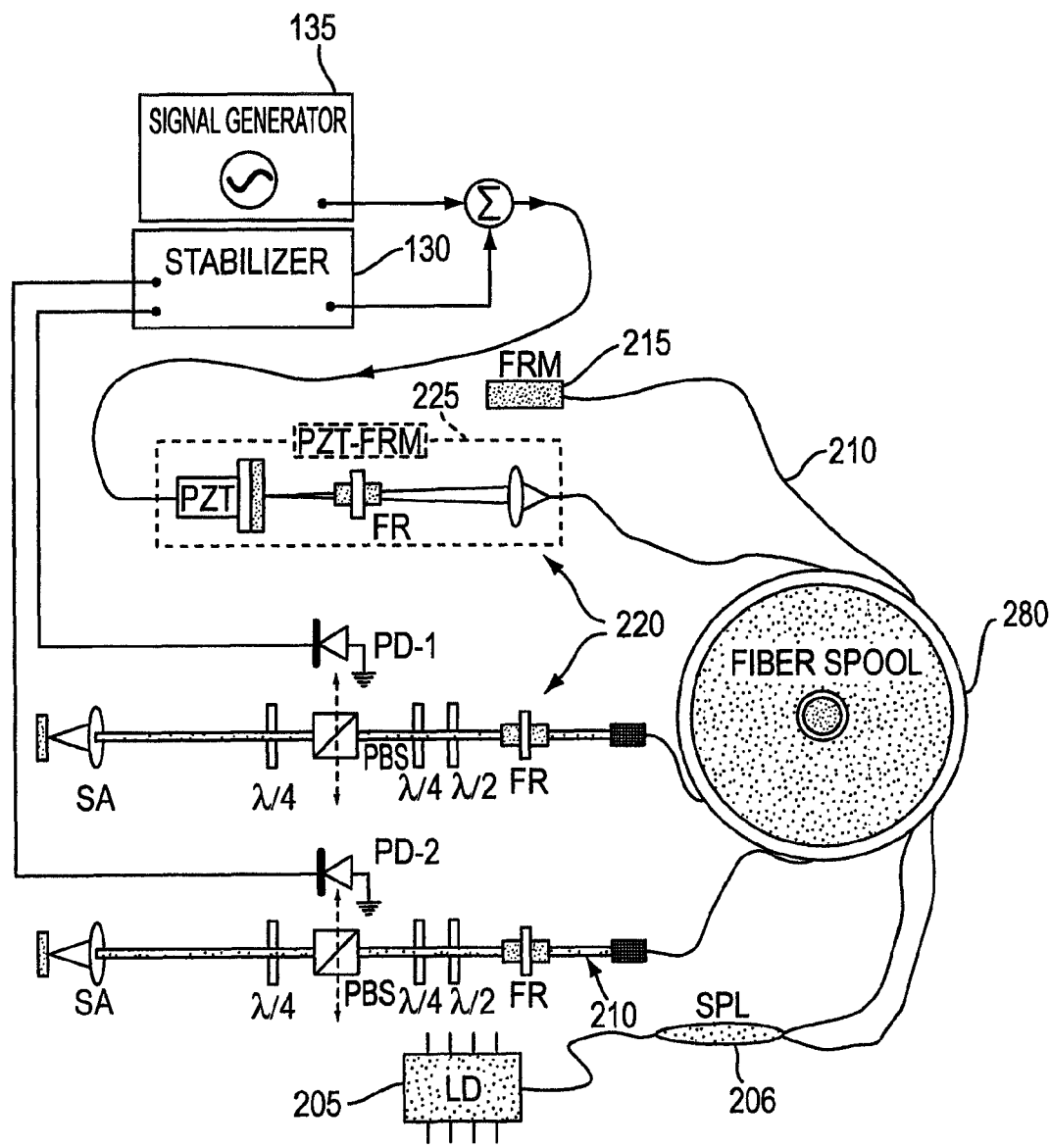
FIG. 4 shows a twin fiber laser system according to the present invention, having two identical mode-locked fibers lasers which use nonlinear polarization evolution as the mode-locking mechanism, in which fibers of both lasers are co-wrapped on the same spool.

FIG. 4 shows a preferred embodiment of the invention for a twin fiber laser system employing two fiber lasers, i.e., a master laser 210 and a slave laser 220.

Both lasers are pumped by the same laser diode LD 205, whose power is divided between the two lasers by a splitter SPL 206. Master laser 210 is terminated by an integrated Faraday rotator mirror FRM 215, while slave laser 220 is terminated by an optical assembly PZT-FRM 225 which is equivalent to FRM 215, but which also contains a mirror mounted on a PZT. The two fiber lasers contain identical modelocking optics (i.e., waveplates λ/4, λ/2, Faraday rotators (FR), and polarizing beamsplitters PBS). Laser modelocking is initiated by saturable absorbers SA. The output pulses from the low-noise output ports of the lasers are detected by photodiodes PD-1 and PD-2 which are used to drive stabilizer 130.

Both fiber lasers have a nominal repetition rate of $v_0$=4.629 MHz. They are based on an environmentally stable design disclosed in M. E. Fermann, L. M. Yang, M. L. Stock, and M. J. Andrejco, "Environmentally stable Kerr-type mode-locked erbium fiber laser producing 360-fs pulses." *Opt. Lett.*, 19, pp. 43-5, January 1994, which uses nonlinear polarization evolution (NPE) as the mode-locking mechanism. The lasers have identical components except for the Faraday rotator mirrors; master laser 210 is terminated with an integrated Faraday rotator mirror FRM 215 which is a single package, while slave laser 220 is terminated by assembly PZT-FRM 225 of discrete components which is equivalent to a FRM, but which also contains a mirror mounted on a PZT. The PZT used here had a total travel range of 40 microns. The lasers are thermally and mechanically coupled by co-wrapping them on the same fiber spool 280. Additionally, both lasers are pumped by the same pump laser diode LD 205 so that the pump noise in the two lasers is correlated. The relative timing between the lasers is set and stabilized by stabilizer 130, which includes a PLL circuit. Once stabilizer 130 has been enabled and the lasers are set at the proper delay, a dithering signal is applied to the PZT of slave laser 220 to make it scan. The dithering signal is applied by a signal generator 135, which is added to a stabilizing signal output from stabilizer 130 to produce a signal for driving the PZT. Alternatively, stabilizer 130 can generate the dithering signal, so that the output of stabilizer 130 includes both the stabilizing and dithering signals. Each laser has two output ports associated with its intracavity polarizer. These two output ports are shown in FIG. 4 as the two outputs of each PBS. These two laser outputs have very different noise characteristics; one is somewhat noisy, and the other has very little noise, due to an optical limiting effect (due to the NPE) which is known to occur in this type of laser. It is this quiet output beam that is detected by photodiodes PD-1 and PD-2 which provide input to stabilizer circuit 130. Use of the quiet output beam as the input to stabilizer 130 helps to minimize the timing jitter.

Figure 5A:
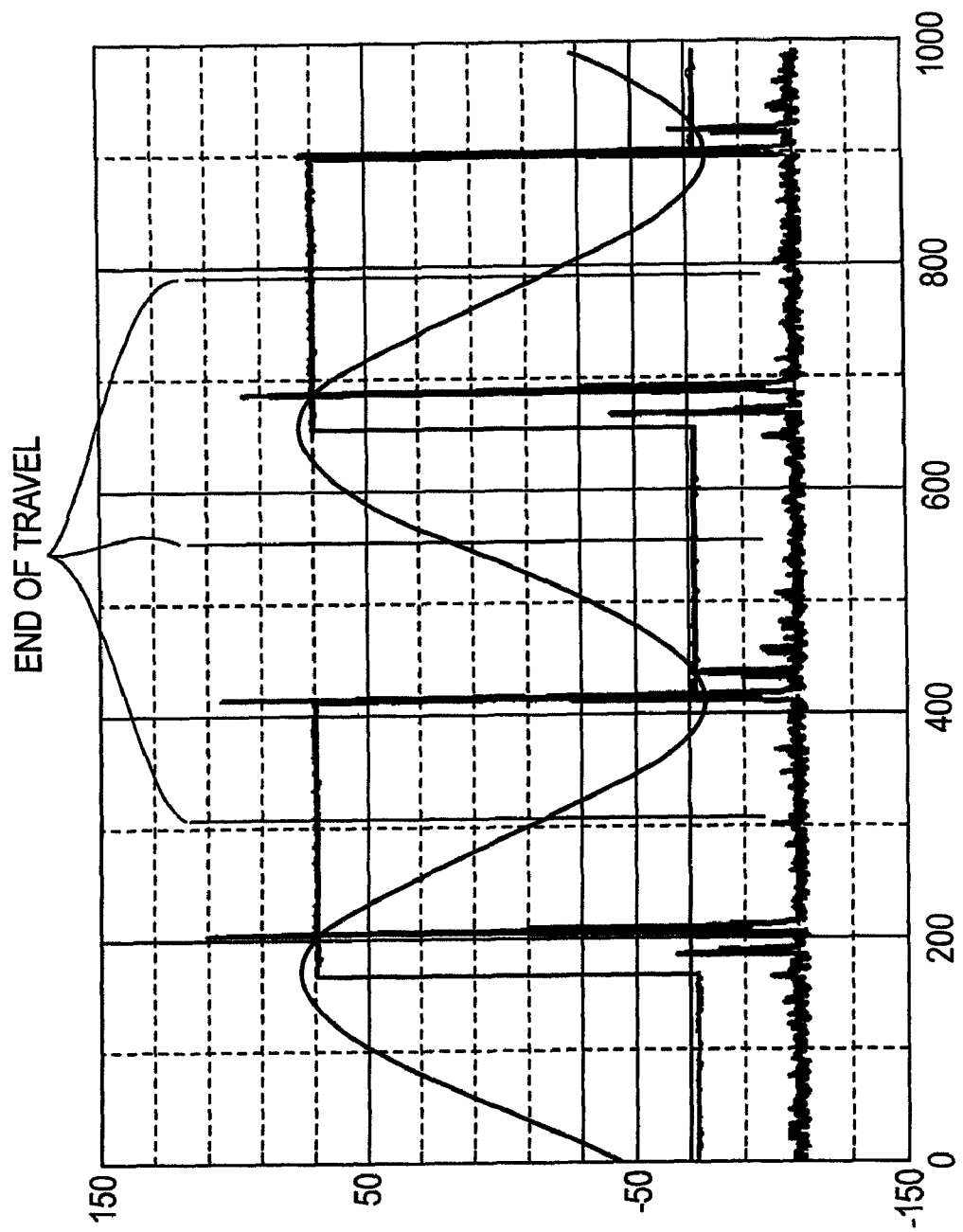
FIGS. 5(A) and (B) show a plot of a cross-correlation signal between two fiber lasers scanned by the dithering method of the present invention, shown in FIG. 4, the sinusoidal voltage applied to the PZT, and the square wave trigger-out of the signal generator.

Sinusoidal time scanning has been accomplished by the inventors by using the twin fiber laser system. FIG. 5(A) shows 2 cycles of a cross-correlation scan between the two fiber lasers shown in FIG. 4, collected with single shot data acquisition, that is, with no averaging. More particularly, FIG. 5(A) shows the cross-correlation signal between two fiber lasers being scanned by the dithering method of the present invention at a scan frequency of 106 Hz and over a scan range of 200 psec. Here, FIG. 5(A) shows two full cycles of scan, showing both forward and backward scans. Also shown is the sine wave voltage applied to the PZT controller, and the trigger out of the signal generator, which appears as a square wave. This plot of FIG. 5(A) was obtained by passing the pulses from the two lasers through a modified cross-correlator which uses sum frequency mixing in a nonlinear crystal, in particular a beta-barium borate (BBO) crystal.

A scanning mechanical delay is used in one arm of a known correlator. However, in the correlator of the present invention, no mechanical delay was used. All scanning was done using the laser dithering method described above. Also, FIG. 5(A) shows the sine wave voltage applied to the PZT controller and the trigger-out of the function generator. Note that the ends of travel of the PZT which are marked on the graph are 90 degrees out of phase with the applied sine wave, as expected according to equations 9 and 10. The scanning range is about 200 psec at a scan frequency of 100 Hz. This is equivalent to scanning a physical delay by 3 cm at a repetition rate of 100 Hz. However, with the twin-laser system the same scanning range is achieved by moving the PZT of the slave laser by only a few microns.

Figure 5B:
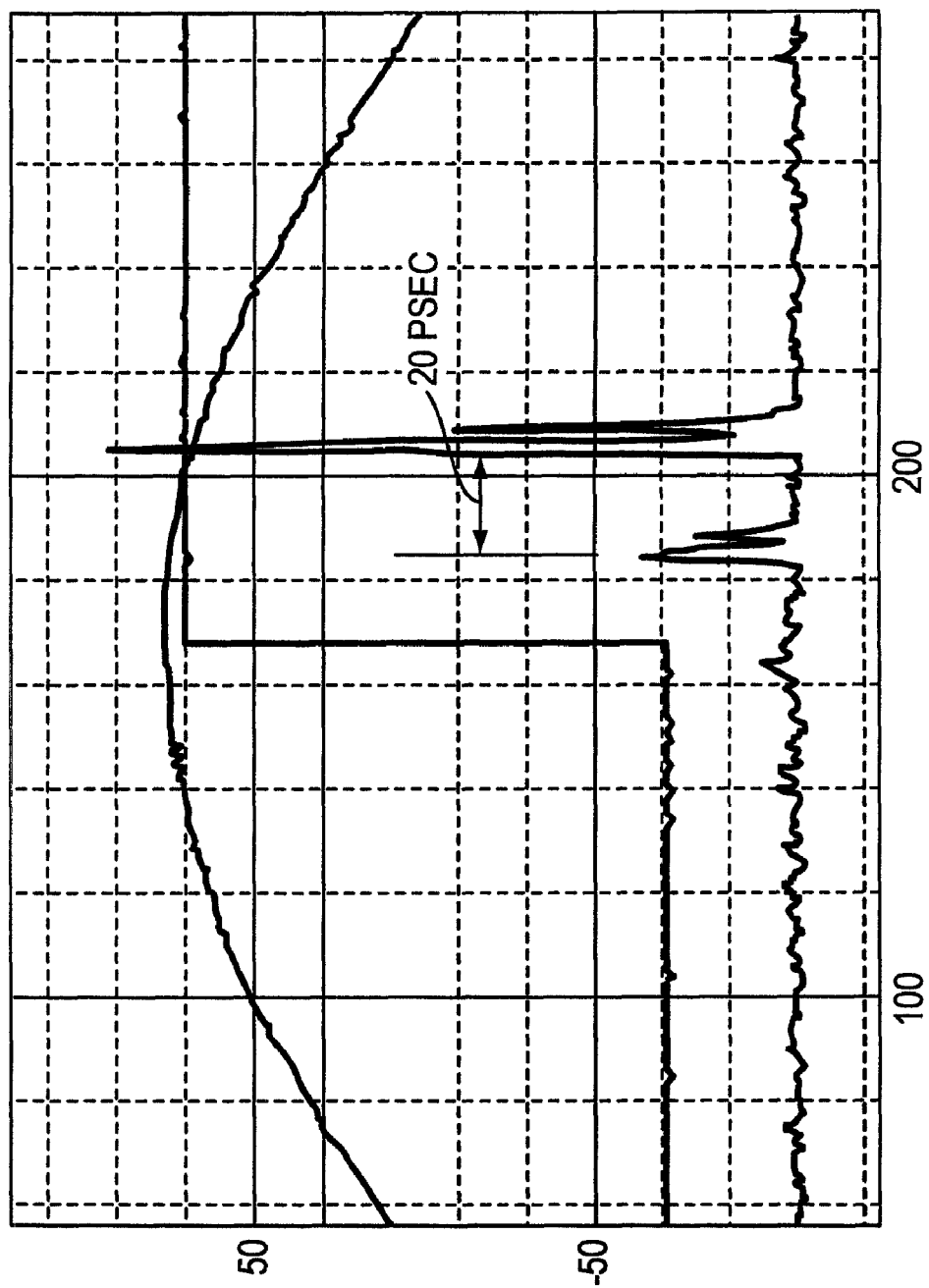
FIG. 5(C) shows a plot of timing jitter data.
Figure 5C:
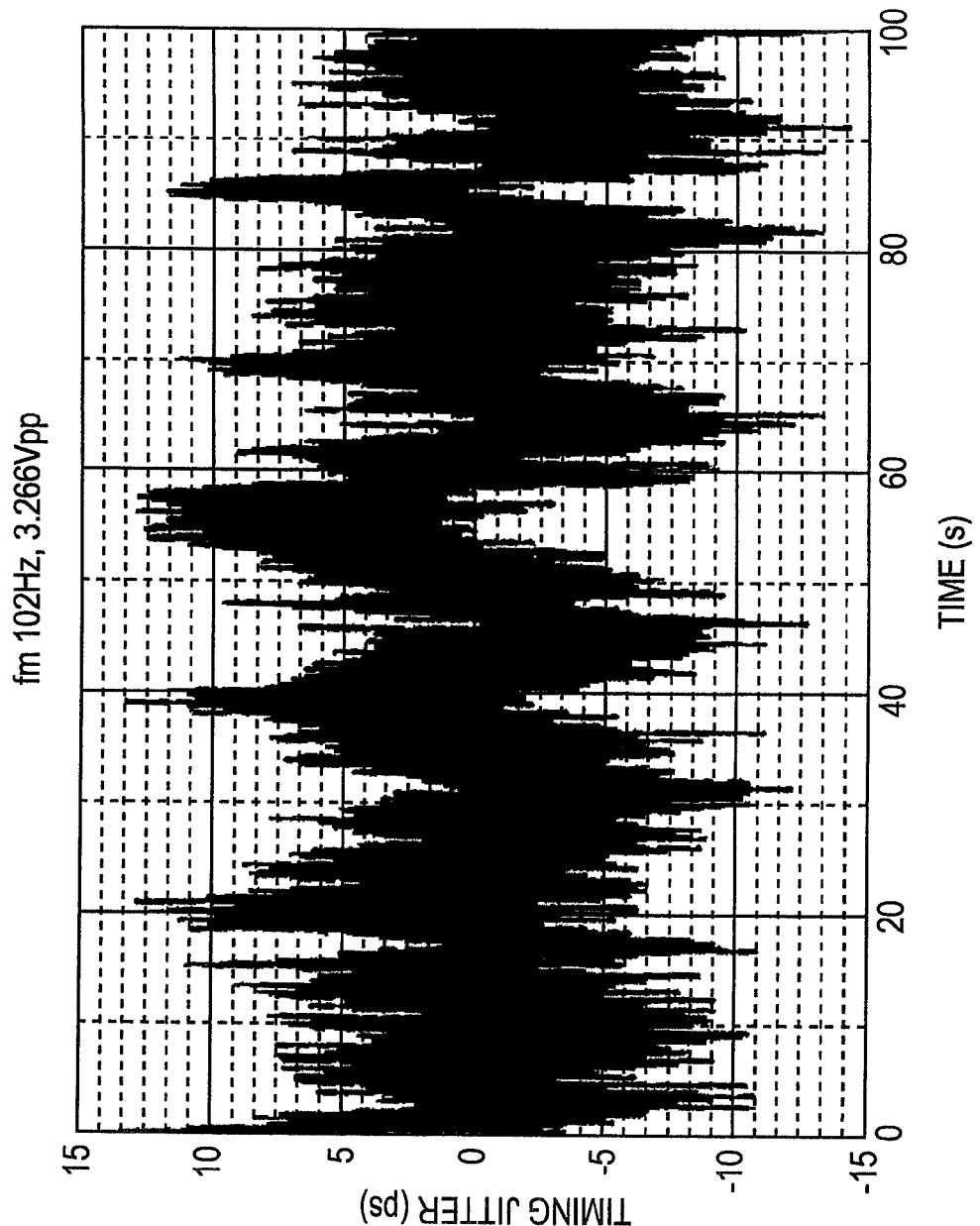

This cross-correlation method was used to measure the timing jitter between the two lasers. The timing calibration was provided by inserting a glass etalon of having a thickness of 2 mm into one arm of the correlator, which creates a sequence of pulses separated by 20 psec. These sequence of pulses are clearly visible on the scans shown in FIG. 5(A). FIG. 5(b) shows the same scan on an expanded time scale showing closely spaced pulses (one laser has satellite pulses) and replicas of the pulse pairs, produced by inserting a 2 mm glass etalon into one arm of the correlator. The pulse pair replicas are separated from the main pulse pair by 20 psec, corresponding to the optical thickness of the etalon. Here, it can be seen that the pulse widths are on the order of 1 psec, and satellite pulses are also present a few psec away from the main pulse. The RMS timing jitter thus measured was $\Delta T_j$=5 psec, with occasional timing deviations of up to ±20 psec. The timing jitter data are shown in FIG. 5(C) where each data point represents the relative time delay between the lasers on each scan at the 106 Hz scan rate.

The measured jitter demonstrates the limitations of the precision of the electronic PLL circuit of stabilizer 130, but it also demonstrates how precise timing information can be obtained in spite of this jitter. If the scan is done rapidly enough, the relative timing jitter within the scan time can be quite small. And if a stable series of timing pulses is provided, e.g., by passing laser pulses through an etalon, then even the jitter during the scan time can be known accurately. In this way, the scan characteristic can be known to subpicosecond accuracy even though the lasers are jittering by several picoseconds.

The beneficial effects of co-packaging the lasers is important. In a previous, and less successful dual laser system built by the inventors, the same pair of lasers were constructed separately on different breadboards and were pumped by different lasers. With the stabilizer enabled, the slave laser would track the master laser for only about 30 minutes before the cavity length mismatch would exceed the 40 micron travel range of the PZT. At this point, tracking became impossible. Thus, even under a normal room temperature environment, the cavity length mismatch between a pair of 5 MHz lasers can drift by more than 40 microns, which is beyond the range of most PZTs. On the other hand, the copackaged system of the present invention is able to track indefinitely, indicating that the cavity length mismatch stays well within the 40 micron limit of the PZT under normal room conditions. Measurements of the absolute and relative frequency drifts show that the relative frequency drift between the two lasers is 7-times less than the absolute drift of one laser. The relative drift can be improved still further by making the lasers truly identical in construction. This can be accomplished by terminating both lasers with identical PZT-FRM assemblies, or by terminating them both with identical FRM packages and changing the slave laser cavity length with a fiber stretcher.

Further reduction of both the relative and absolute timing drifts can be accomplished by acoustic damping of fiber spool 280 and other components, and building the lasers in the same enclosure, which could itself be acoustically damped and temperature controlled. Eventually, with all of the above methods employed, relative laser jitter could reach the quantum limit (H. A. Haus and A. Mecozzi, "Noise of mode-locked lasers," IEEE J. Quantum Electron., QE-29, pp. 983-996, March 1993). Since the quantum-limited timing jitter increases with increasing dispersion, the jitter could be further reduced by operating the mode-locked lasers near the zero-dispersion wavelength.

Dithering the end mirror of a mode-locked laser can induce amplitude fluctuations at the scan frequency due to mirror misalignment and defocusing. The misalignment effect can be minimized by focusing on the PZT-mirror to reduce angular sensitivity, and by using a 3-point mirror-scanning PZT to preserve alignment, as is done with commercial scanning Fabry Perot interferometers. The defocusing effect can occur when the scan amplitude is an appreciable fraction of the confocal parameter of the beam waist incident on the PZT-mirror. In a fiber laser, this defocusing causes a reduction in the coupling efficiency of the beam back into the fiber, which in turn, causes power fluctuations. Thus, tight focusing on the PZT mirror is undesirable. A judicious choice, of beam collimation can reduce the defocusing effect. For example, if a PZT is used having a scan range of 40 microns, a confocal parameter of at least a few millimeters would be required. Then, the quantity $(\Delta L/Z_R)^2 \sim 10^{-4}$ is quite small, where $Z_R$ is the confocal parameter of the beam waist at the PZT mirror. When this quantity is small, the amplitude modulation of the laser is correspondingly small.

It should be pointed out that even if slight mirror misalignments cause some small amplitude fluctuations during the scanning, the beam pointing stability is not degraded in any way, due to the guiding properties of the fiber. However, with a solid-state modelocked laser, some deviation of the output beam could occur if measures are not taken to prevent it.

An alternative laser system might have both lasers terminated by identical FRM, and the cavity lengths could be adjusted by a PZT fiber stretcher, such as a piezoceramic tube actuator PiT 40×18×1 made by Piezomechanik GmbH of Germany.

Timing Calibration

Even with the PLL circuit of stabilizer 130 stabilizing the average relative timing delay, this position can fluctuate by several picoseconds so that it is necessary to insure that the data acquisition unit 50 is properly triggered with a timing signal which has the desired accuracy, i.e. 100 fsec. Such a signal can be obtained from a cross-correlator employing nonlinear optical mixing in a nonlinear crystal such as BBO, as was done in the demonstration mentioned above, and by others, such as Kafka et al. This type of triggering has also been shown to be essential in obtaining high accuracy in metrology measurements, even when using a mirror shaker for the scanning time delay. However, while this is necessary, it may not be sufficient. Jitter measurements show that the timing can fluctuate not only from scan to scan, but even during a single scan cycle. That is, the scan rate $R_{scan}$, changes from scan to scan, and even during the scan cycle. It is therefore essential that time scaling operations occur before signal averaging. Thus, it is necessary to have at least two timing pulses per scan from the correlator—one for triggering, and the other for time scale information. To do this, the present invention fills the scanning interval with a sequence of pulses, either uniform or nonuniform (in both amplitude and time). In this way, timing information can be obtained about the scanning interval on each and every scan cycle.

Timing Scale Generation

Figure 7A:
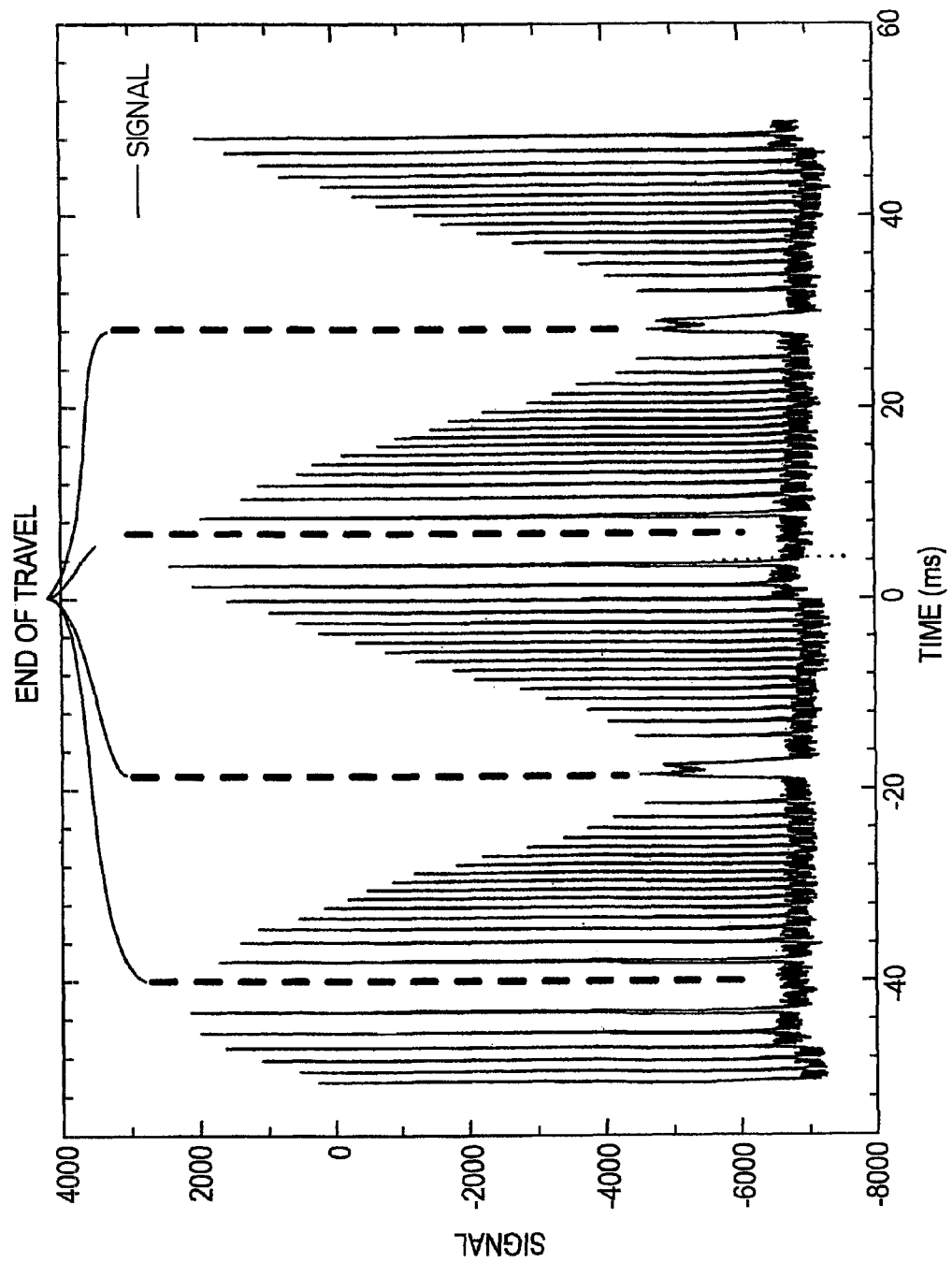
FIGS. 7(A)-(D) show plots of two full scan cycles including the cross-correlation signals between a single laser pulse and the pulse train transmitted through an air-spaced PP etalon.
Figure 7B:
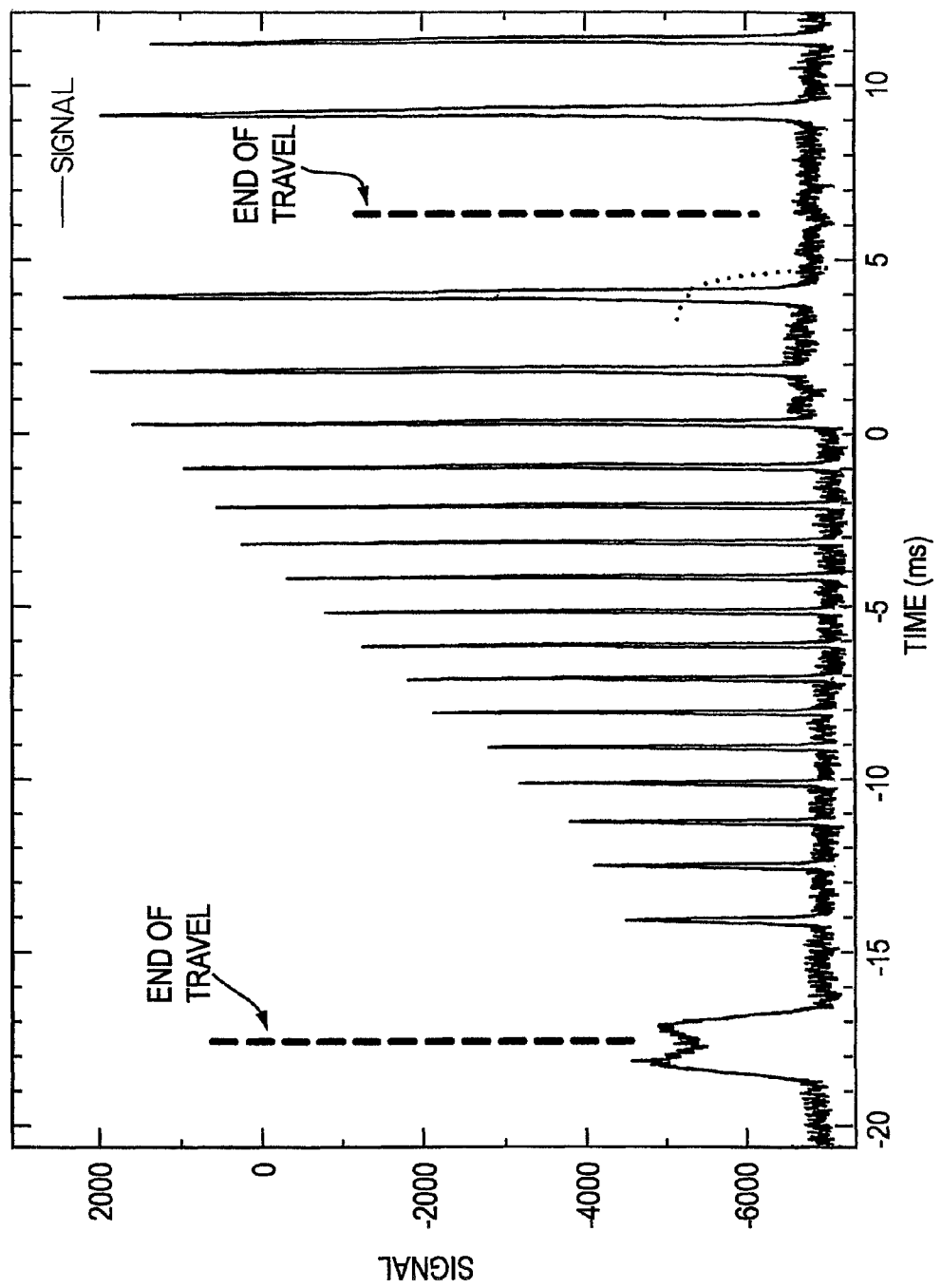
Figure 7C:
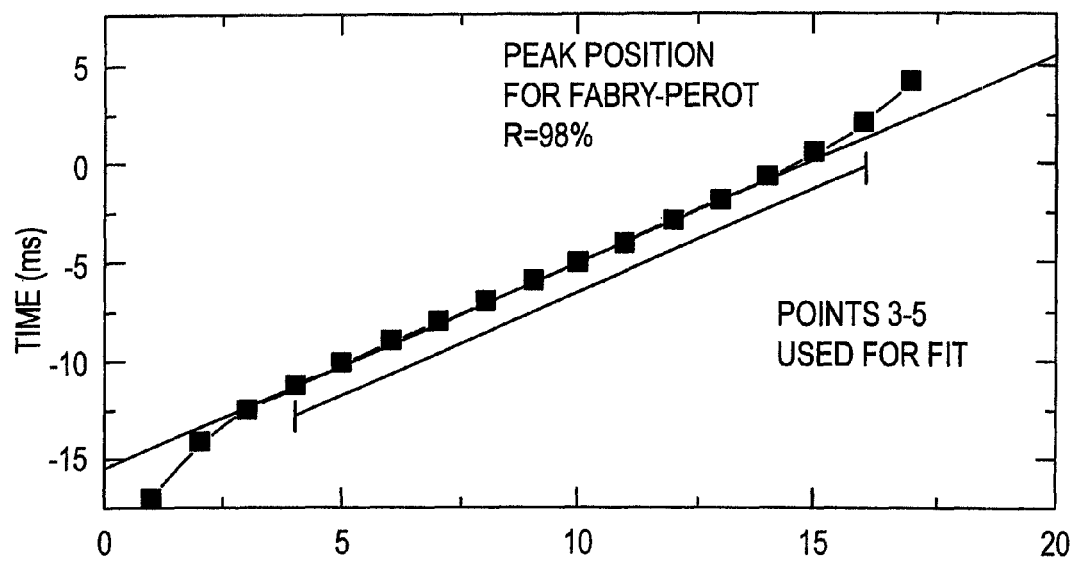

An important key point of the time scale calibration is selecting the optical methods used to generate the timing information. In a preferred embodiment, a sequence of pulses can be produced by reflecting a single pulse from a high-finesse Fabry-Perot (FP) etalon to produce a temporally uniform sequence of many pulses, as shown in FIGS. 6(A) and (B). Because the FP etalon is being used as a "rattle-plate", in which the pulse is internally reflected many times within the FP etalon (i.e., a high-Finesse FP etalon), rather than its resonant properties being used, the transmission through it is rather low. An example of employing an FP etalon consisting of two mirrors with R=98%, thus having a transmission of T=0.0004, is now discussed. The transmitted pulse train, shown in FIG. 6(A), is a series of pulses, separated by the transit time of the FP etalon, ringing down by a decay factor which is dependent on the mirror losses and the misalignment. That is, the transmitted pulse train is attenuated by the factor $T^2$ where T is the transmission of the etalon surfaces. The transmitted pulse train is more or less uniform with the pulse intensities slowly decaying upon each round trip. The first (and largest) pulse in the train is 2500-times weaker than the pulse incident on the FP etalon. FIGS. 7(A) and (B) show the slowly decaying pulse train transmitted through a real air-spaced FP etalon with surface reflectivities of R=98%, and mirror spacing of approximately 1 mm. FIG. 7(B) shows, on an expanded time scale, a plot of a single backward scan having 17 pulses and showing the point corresponding to the end-of-scan. These data were obtained by simply inserting the FP etalon into one arm of a conventional scanning correlator which employed a retro-reflector mounted on a voice-coil (speaker). Since a sinusoidal voltage was applied to the speaker, the time delay was scanned in a more or less sinusoidal fashion. The spacings of the pulses versus time give the scanning characteristic of the shaker-mirror, which is shown in FIG. 7(C). The total scan range is readily calculated from these data, as:

$$T_{max} \approx (17\ \text{pulses}) \times (6.7\ \text{psec/pulse}) = 114\ \text{psec} \qquad \text{Eq. 11.}$$

Figure 7D:
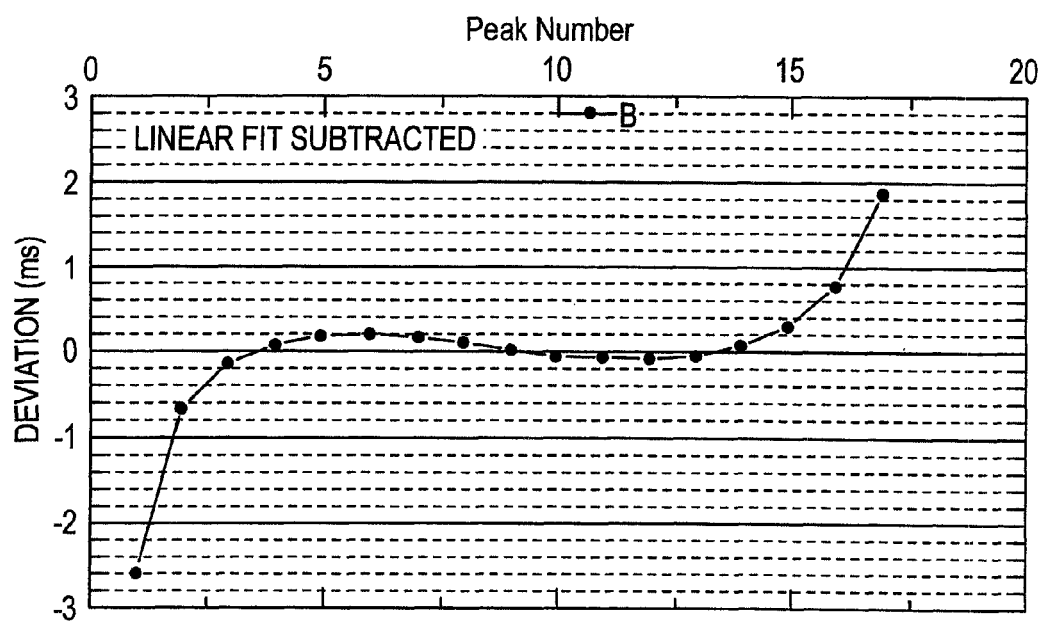

The data in FIG. 7(C) show that, as expected, the scanning characteristic is not exactly linear. To show the deviation from linearity, the data is fitted with a straight line, and then the data is subtracted from this best fit. The result, shown in FIG. 7(D), is the deviation of the time scanning characteristic from linearity.

The reflected pulse train is identical to the transmitted pulse train, which are each shown in FIG. 6(B) except that the reflected pulse train is preceded by a prompt pulse which is the first surface reflection and which contains most of the pulse energy (i.e., 98%). Since this first reflected pulse is at nearly full intensity, it is useful for any of the experimental applications or measurements to be performed. Note that this prompt pulse is 2500-times more intense than the pulse train immediately following it. In most cases, this weak pulse train will not seriously affect the measurements. In other cases, however, it may be unacceptable.

Of course, etalons with lower finesse can also be used, but then the transmitted pulse train decays much more quickly, and the correlator's dynamic range becomes the limiting factor. For example, an etalon with surface reflectivity of R=30% produces a rapidly decaying series of pulses in which each pulse is 10-times weaker than the previous pulse. Thus, only about 3 pulses can be used for calibration in real time, since most data acquisition has a single shot dynamic range of only three decades. This was the case for the correlation shown in FIG. 5. This effect can be overcome to some extent by dynamic range compression schemes, for example, by using a logarithmic amplifier.

In yet another embodiment, combinations of FP etalons can be used. For example, a thin etalon (such as a cover-slip) would produce a pair of closely spaced pulses (~1 psec) which would then be sent to a higher finesse FP with a larger spacing (e.g., 20 psec). The result would be a sequence of pulse pairs spaced by 20 psec. This gives local derivative information about the timing characteristic.

The FP etalons could be either solid or air-spaced. A solid etalon is more rugged and compact, but an air-spaced etalon is adjustable and avoids the problem of pulse broadening due to group velocity dispersion which would occur for those pulses which have made many round-trips through the etalon. For high accuracy, it is necessary to control the temperature of the etalon. For example, the fractional change in group delay through a piece of fused silica is approximately $\Delta l/l \sim 10^{-6}/°C$. Thus, if 1 micron (6 fsec) of accuracy is required over an entire range of 1 meter (6 nsec), then the etalon temperature should be constant to within 1° C. Air-spaced etalons have an advantage in that they can be constructed using thermally compensating mounting techniques. Thus, the temperature sensitivity can be reduced over that of solid etalons, and temperature control may not be required for normal room-temperature operation.

Figure 8A:
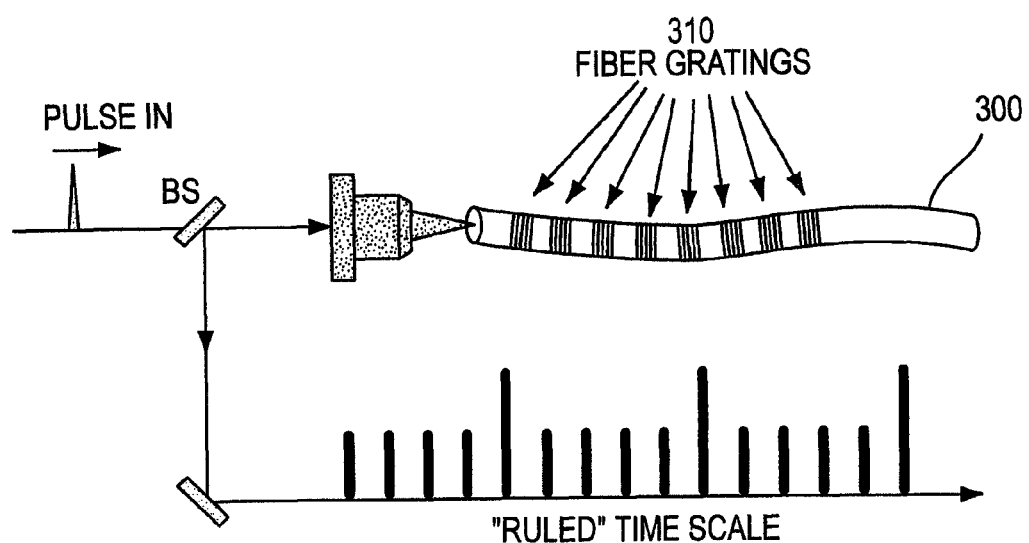
FIGS. 8(A) and (B) show a pulse train generator consisting of a series of photorefractively-grown chirped fiber gratings.

Another possible implementation is to use a series of photorefractively grown fiber gratings 310, as shown in FIG. 8(A), grown on an optical fiber 300. The gratings can be so tailored that the emerging pulse sequence can be either uniform or nonuniform. In this case, the spacing is uniform, but the amplitudes are nonuniform in order to produce a "ruler" scale, with larger pulses occurring for every 5th or 10th pulse, as shown in the figure. Of course, the ability to grow fiber gratings at any desired position in the fiber gives great flexibility, and it may be advantageous to place them at nonuniform spacings in order to eliminate timing ambiguity.

Figure 8B:
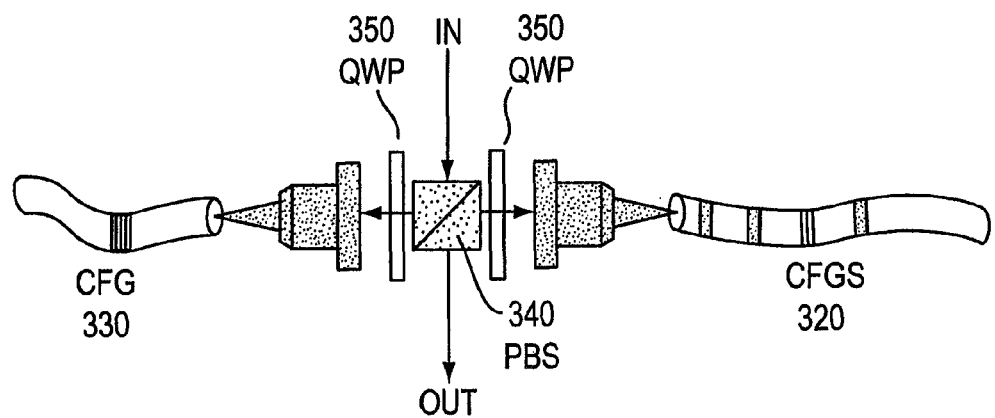

Additionally, if it is desired that the pulses traverse substantial lengths of fiber (i.e., >0.5 meters) the pulses will broaden due to group velocity dispersion (GVD) in the fiber. Then, a series of chirped gratings could be grown in such a way that the GVD of the fiber being traversed is properly compensated. In fact, chirped gratings are necessary for high time resolution due to the fact that normal unchirped gratings have reflectance bandwidths of only about 2 nm making them unsuitable for subpicosecond pulses. At a center wavelength of 800 nm, a 100 fsec pulse has a full-width half-maximum (FWHM) bandwidth of 8 nm; and at a wavelength of 1500 nm, the bandwidth is about 30 nm. Only chirped gratings have sufficiently broad bandwidths for these pulses. It is known that reflecting femtosecond pulses from chirped gratings causes the pulses themselves to become broadened and chirped. In this case, it is necessary to sequentially reflect the pulses from two chirped gratings with opposite senses of chirp, as is schematically illustrated in FIG. 8(B). Here, pulse broadening is prevented by using a compensating scheme in which the pulse is first reflected from a chirped grating sequence CFGS 320 and subsequently reflected from a nearly identical chirped grating CFG 330 which is chirped in the opposite sense. The order can be reversed (i.e., reflect first from CFG and then from CFGS) with equal results. Efficient splitting and reflection can be provided by polarizing beamsplitter PBS 340 and by quarter-wave plates QWP 350. This technique has been successfully applied toward chirped pulse amplification in fibers by A. Galvanauskas, M. E. Fermann, D. Harter, K. Sugden, and I. Bennion, "All-fiber femtosecond pulse amplification circuit using chirped Bragg gratings." *Appl Phys. Lett.*, 66, pp. 1053-5, Feb. 27, 1995. The object of this aspect of the invention, however, differs from that of Galvanauskas et al. In that work, a pair of gratings were used to stretch the optical pulse to very long durations (>300 psec) for chirped pulse amplification, and then to recompress the pulses. In the present invention, chirped gratings are used because unchirped gratings have insufficient bandwidth (~1 nm) to support short pulses, and because there will be some need to compensate the GVD of the fiber for pulses which have traversed substantial lengths of fiber. Here, there is no desire to stretch the pulses, because the object of this aspect of the invention is to produce a sequence of short pulses.

Two fiber gratings can also be used to form a fiber FP etalon, which could be used either in transmission or in reflection. Alternatively, a passive optical fiber loop could be used. Other structures which can produce reflections are poor splices between optical fibers and microbends in a fiber. Temperature control of the fiber would be necessary in these cases, or variations in timing calibration would be known beforehand, and compensated for mathematically.

Pulse sequences can also be produced by a series of partially reflecting mirrors, with the reflectivity and spacing of each mirror being carefully chosen so as to give the desired sequence of pulses, if it is physically possible. Algorithms have been developed for calculating the required mirror parameters to produce the desired pulse sequences from a single pulse (V. Narayan et al., "Design of multimirror structures for high-frequency bursts and codes of ultrashort pulses," IEEE J. Quantum Electron. QE-30, pp. 1671-1680, July 1994). There are a number of other types of optical devices, composed of partial reflectors, which can be used as well to generate pulse trains from a single pulse.

Arbitrary, programmable pulse sequences can be produced by passing a laser pulse through a pulse-shaping dispersive delay line (DDL). This gives much greater flexibility than the methods mentioned above, but is limited in terms of the maximum achievable pulse spacing. Practical limits are about 100-200 psec. Any larger pulse spacing requires a physically larger setup, which can become prohibitive.

Another embodiment, most useful for low repetition rate ($\leq$30 MHz) lasers at wavelengths near 1550 nm, would be to inject a sequence of pulses into a regenerative soliton storage ring consisting of a fiber loop with a gain section (e.g. Er-doped fiber). The pulse sequence injected into the ring may be obtained in any number of ways including the methods discussed here (i.e., Fabry-Perot etalon, fiber gratings, pulse shaper, etc.). Because the loop is regenerative, it is necessary to dump it and re-inject it on every laser pulse. This would occur every 200 nsec for a 5 MHz laser. The dumping and injection can be accomplished by some type of optical switch, either AO or EO, which are commercially available.

Yet, another embodiment would be to inject short pulses from one laser into a laser diode biased at or near threshold. The laser diode facets have a reflectivity of 30%, forming a low-finesse FP etalon. However, the gain of the laser diode would retard or prevent the "ringdown" of the optical pulses. In this way, it should be possible to obtain a train of several tens of pulses. Eventually, group velocity dispersion and gain narrowing in the diode would broaden pulses which make many round trips through the structure, and thus limit the number of pulses which are actually usable. This device could be used either in reflection or transmission.

Extremely fine (sub-micron) calibration can be obtained by inserting a birefringent crystal (e.g. quartz) into one beam of the measurement system and comparing the pulse arrival times when the pulses propagate along the ordinary and extraordinary axes of the crystal. Typical plate thicknesses of 1 mm give a few wavelengths of retardation, which produces a readily discernable difference in pulse arrival times if pulses of 100 fsec duration or less are used.

Cross-Correlator Optics

The sequence of pulse signals generated according to the above-described methods are cross-correlated with the other laser pulses using some sort of nonlinear element. Various nonlinear processes can be used for detection of pulse coincidence or relative pulse timing. Some optical nonlinearities which could be used include, but are not limited to: optical mixing via second harmonic generation (SHG), sum frequency generation, gain saturation, absorption saturation, four-wave mixing (FWM), and nonlinear response of photocurrents. A likely choice for the nonlinear element is a SHG crystal. However, using a SHG crystal has the disadvantage of only providing a signal when there is overlap between the laser pulses. Thus, it can serve only as a coincidence detector. This requires the use of the various pulse train generators, pulse shapers, etalons, . . . etc., discussed above. In some situations, the extremely high accuracy which can be obtained using SHG crystals is not required. In some cases it may be more desirable to use an element which has a noninstantaneous response, and thus, can give information about time delay via amplitude information. There are a number of devices or materials which might be suitable, such as traveling-wave laser diode amplifiers (TWAs); saturable absorbers;

photodetectors, which rely on saturation effects, such as PIN diodes and avalanche photodiodes (APDs); or perhaps even SEED devices. For example, TWA's have been used for optical clock recovery in optical communications. They have the advantage that when they are driven far into saturation, they become relatively immune to amplitude fluctuations. Here, the accuracy and range are determined by the recovery time of the device. TWA devices are known to measure phase accuracy to about $10^{-3}$ radians. In such optoelectonic devices, nonlinearity of optical absorption is not the only method which can provide timing information. Pulse timing information can also be obtained by monitoring electrical properties such as photocurrent, voltage, capacitance, etc., of the device as pulses propagate through them. This would be a significant simplification over detecting the change in optical properties.

These timing calibration techniques, although intended for use with the fast-scanning laser method, are expected to be applicable not only to the laser scanning systems described here, but also to free-scanning lasers, dual-wavelength mode-locked lasers, and even to the more conventional scanning systems employing physical delays. An example of this is the calibration data shown in FIG. 7 which was obtained for a scanning system which consisted of a retro-reflector mounted on a voice-coil (speaker). Since a sinusoidal voltage was applied to the speaker, the time delay was scanned in a more or less sinusoidal fashion. The scanning characteristic shown in FIG. 7(C) can be used to correct the time scale of any data acquired during the scan. When the actuator is driven at higher amplitudes, near its physical limits, the scanning characteristic deviates significantly from a sinusoid. This can be corrected as well. Other devices, such as rotating glass blocks and rotating mirrors, also have nonlinear scan characteristics which can be corrected by the timing methods of the present invention, described here.

Laser Stabilization

Because any cavity length error is constantly accumulated on each round trip of the laser cavity, very small cavity length fluctuations can cause large timing errors. Thus, it is necessary to use a servo loop to hold the time-averaged repetition rate to $v_1$; or equivalently, the time-averaged cavity length mismatch, $\Delta L$, must be held to zero. The feedback signal which can be used to control the average cavity mismatch is derived from a pair of photodetectors PD-1 and PD-2 shown in FIG. 9, which feed into a conventional phase locked loop (PLL) circuit. As discussed earlier, the accuracy of such a PLL stabilizer system, has been measured and been found able to synchronize the two fiber lasers to within 5 psec RMS with maximum timing excursions of up to 20 psec. The quoted stabilization accuracy is the current state of the art, and by no means represents the ultimate attainable limit. It should be possible to substantially increase the accuracy to well below 1 psec. However, it is not expected that the stabilization accuracy will ever approach the desired time resolution, which in some cases could be 1 fsec or even smaller. For this reason, the timing calibration methods described here will still be required.

Figure 9:
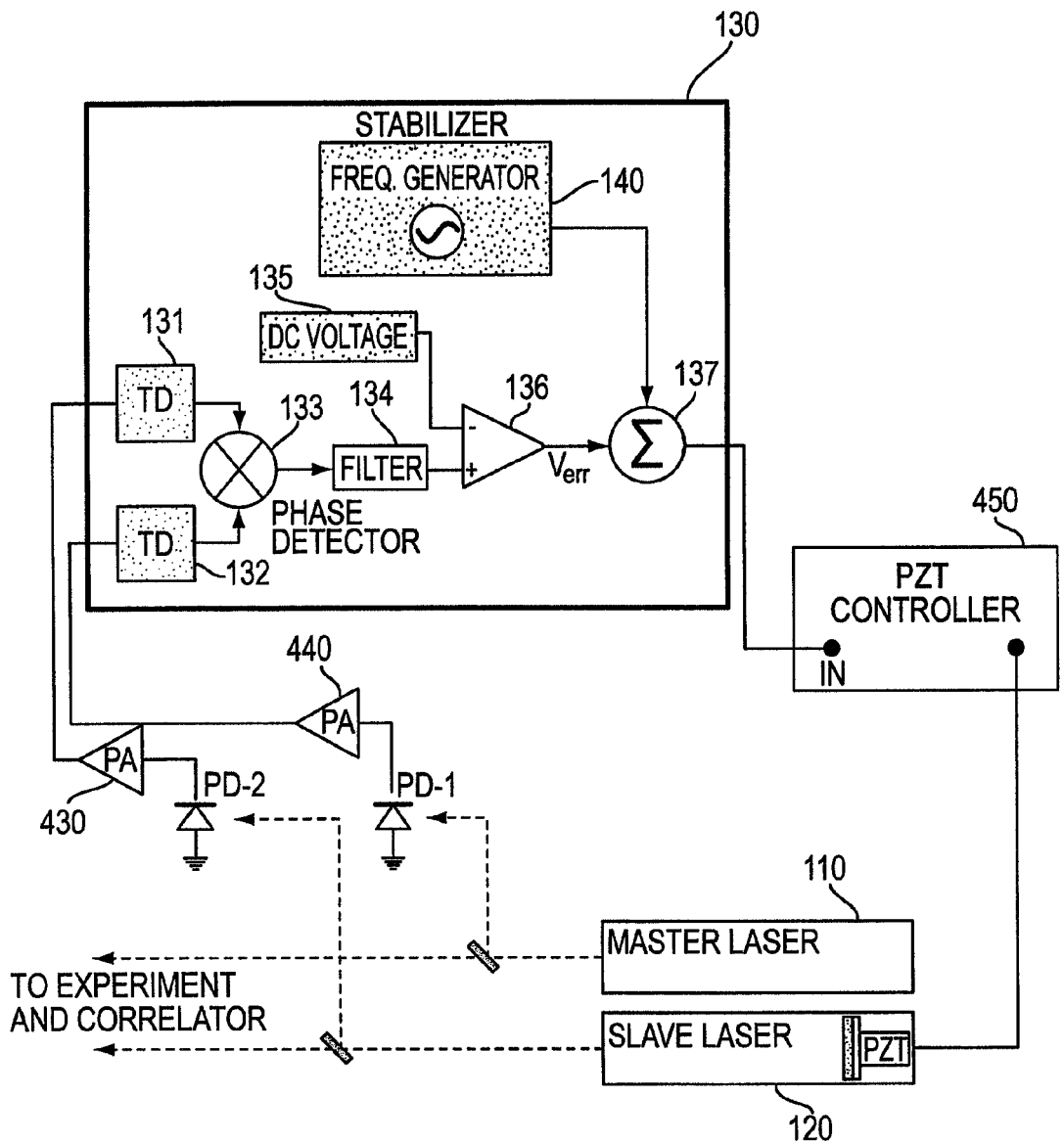
FIG. 9 is a detailed schematic diagram of a laser stabilization and dithering system.

A detailed diagram of the preferred embodiment of the laser stabilization and dithering system, including stabilizer 130, is shown in FIG. 9. Stabilizer 130 includes timing discriminators TD 131 and 132, a phase detector 133, a filter 134, a DC voltage generator 135, an amplifier 136, a frequency generator 140 and an adder 137. Pulse amplifiers (PA) 430 and 440 receive the electrical pulses output from PD-1 and PD-2, respectively. The pulse amplifiers 430 and 440 amplify the received electrical pulses and output them to timing discriminators 131 and 132, respectively. Timing discriminators 131 and 132 condition the signals before they are input to the phase detector 133. The PZT controller used here is a commercial PZT controller unit. This is a high-voltage amplifier which takes an input signal in the range of 1-10 volts, and produces a proportional output in the range of 0-150 volts. Although the PZT controller unit is shown as a separate unit, it could be, and preferably is, integrated into stabilizer 130.

In a preferred embodiment of the stabilizer 130, the phase detector 133 for the PLL can be a standard RF phase detector, or mixer, or a logic gate, such as an XOR gate, which has improved linearity. The linearity is very important if it is desired to perform scanning of any subinterval of the round trip time. Alternatively, a time-to-amplitude converter (TAC) can be used as the phase detector. This is also very linear, and would be especially appropriate at low repetition rates, such as 5 MHz. One limitation to highly accurate phase stability is the AM to FM conversion which can occur in a simple RF mixer. That is, laser amplitude fluctuations are converted to timing fluctuations by the mixer. It is thus desirable to perform signal conditioning on the electrical pulses which are produced by the photodiodes PD-1 and PD-2. This can be accomplished most readily by using timing discriminators 131 and 132 before phase detector 133, as shown in FIG. 9. However, this effect can also be minimized by reducing the amplitude noise of the lasers. It is known that an optical limiting process occurs during mode-locked operation under certain conditions, and for certain output ports of the laser. This greatly reduces the timing jitter when the stabilizer is enabled.

It is also important that the scanning frequency be greater than the bandwidth of the stabilizer system. In this way, the PLL would maintain the average time position properly, but would not counteract the applied mirror scanning. The twin fiber lasers described earlier were stabilized using a PLL circuit which had a bandwidth of only 30 Hz. This rather low bandwidth is advantageous for allowing scan rates ranging from 30 Hz up to several kHz. However, in order to be able to use a 30 Hz stabilizer bandwidth and still maintain synchronization with <10 psec accuracy, the intrinsic relative timing jitter of the laser pair must be very low. This is achieved using the methods of construction described earlier, which ensure that the two lasers are subjected to the same environmental conditions to the greatest extent possible.

It is also possible that a simple correlator could provide the necessary feedback signal for stabilization. While the laser is scanning, the peak position, as measured by the correlator, could be used as an error signal to feed back to stabilizer 130. Note that the simple stationary cross-correlator technique of Dijaili et al. will not work here, since in the present invention the lasers are constantly scanning.

The fast scanning system of the present invention has many advantages over conventional scanning physical delays and free-scanning lasers. In particular, unlike the conventional scanning physical delays, which have moving arms, no misalignment or defocusing of the laser beams occurs in the present invention even when scanning large delays of several nsec. With physical delays, very careful alignment must be performed, and the confocal parameter must be >1 meter for even a 1 nsec delay line. Furthermore, high scanning speed, and even hypersonic scan velocities are possible with the present invention. However, with a physical delay, scanning even 1 nsec at 100 Hz (100 feet/sec) is not practical. Although, with the present invention, large (adjustable) scanning ranges are possible, for example, (from ~50 psec up to 200 nsec for a 5 MHz fiber laser). To achieve such a scanning range in a conventional scanning system, 200 feet of delay line would be required. Also, there is no need to employ a high repetition rate laser for better duty cycle, as in conventional free scanning systems. Further, large temporal dynamic range is possible, which would be useful for scanning of remote targets or OTDR. For example, a total scan range of $T_R=200$ nsec with time resolution less than 1 fsec gives a temporal dynamic range of more than $10^8$. Also, an improved duty cycle with greatly reduced dead-time is achieved, unlike the conventional free scanning system. Also, extremely simple and compact cross-correlator design is now possible with the present invention, without any moving parts. For example, the correlator could be the size of a Game-Boy. Moreover, experimental setups are greatly simplified because pathlengths do not need to be matched in the present invention.

The fast scanning and timing calibration methods discussed above can be used to perform many types of measurements and experiments. A few of the applications in which the methods and apparatuses of the present invention can be used, are discussed below. However, a person skilled in the art will readily understand that the present invention is applicable to many applications and is not limited to the following applications described below.

Figure 10:
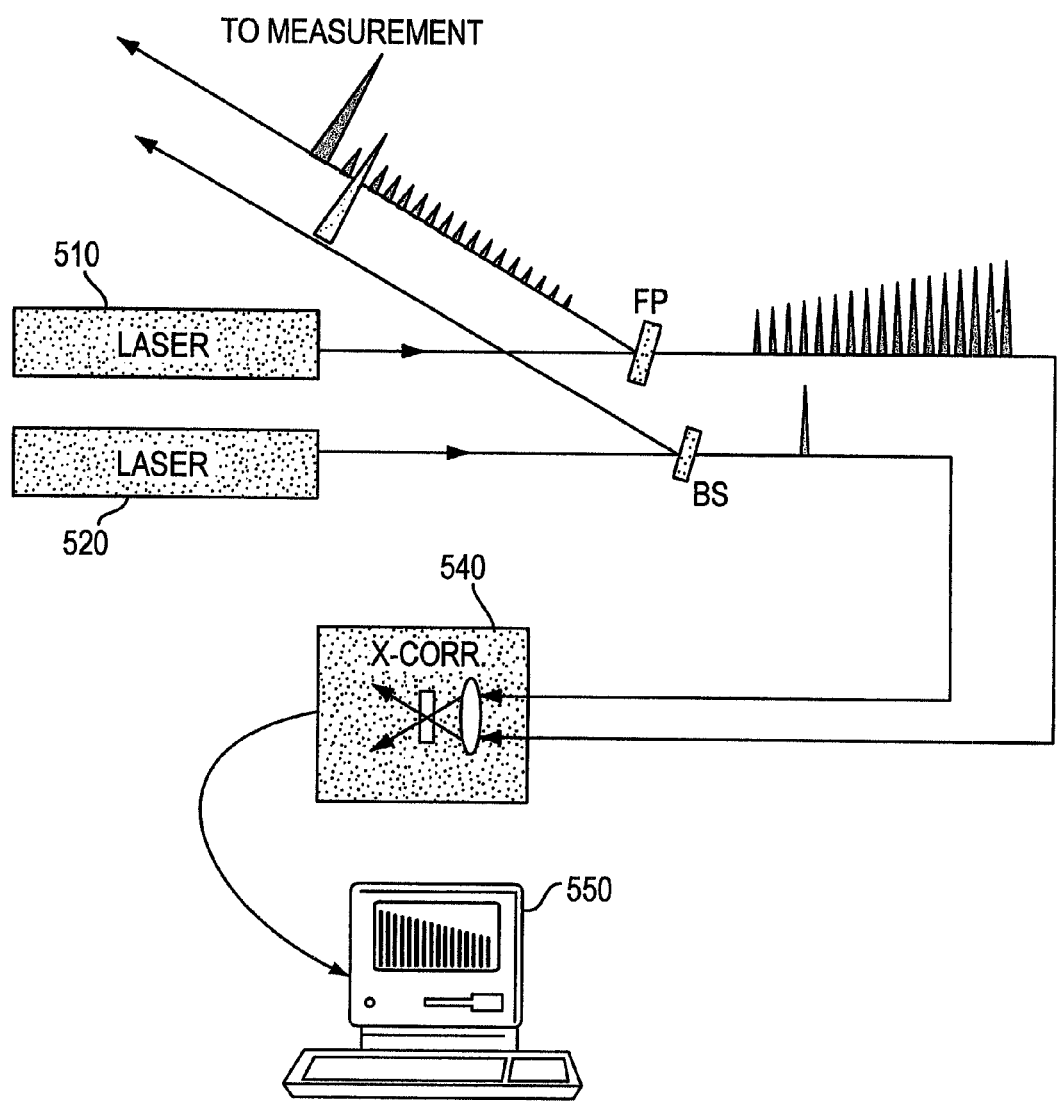
FIG. 10 is a schematic diagram of a measurement system employing the fast scanning lasers and the timing calibration method according to the present invention.

FIG. 10 shows the preferred embodiment of a general measurement system employing the fast-scanning laser system and the timing calibration method using a FP etalon, according to the present invention. Pulses from laser 510 (laser 510 may be either the master or slave laser, it does not matter which) are incident on a FP etalon. The transmitted pulse train transmitted through the FP etalon is sent to a timing unit 540 in which it is cross-correlated with a pulse from laser 520, to generate a data stream which gives a calibrated time scale. The pulse train reflected from the etalon is sent to a measurement unit (not shown) along with a pulse from laser 520. The data stream from the measurement unit is input into the "Y-channel" of the data acquisition system (DAQ) 550 while the data stream from the timing unit is sent to the "X-channel" of DAQ 550. This information can be used in two different ways.

1. On-the-fly (OTF) time scale correction—In this technique, the timing pulses form a time scale. For example, if sinusoidal scanning is used, then even a uniform pulse sequence will appear non-uniform in time. Fast processors could use this time scale information on each scan to appropriately adjust the scanning data (e.g., by using interpolation) with the correct time scale before signal averaging.

In other words, each scanning point is corrected by the fast processor based on the time scale formed by the timing pulses. For example, FIG. 7(C) shows the scanning characteristic for each peak of the scan shown in FIG. 7(B), and FIG. 7(D) shows the linear deviation of these points. This time scale information can be used to correct for the deviations, in essence calibrating each peak "on-the-fly."

2. Scan rejection (smart triggering)—This technique uses a "scan-selector" which looks for a number of timing pulses (at least two) to occur within certain well-defined time slots relative to the trigger pulse. The selector then makes a GO/NO-GO decision on whether to sum the scan data into the signal averager. If the timing pulses from the correlator fall within the time slots, the scan is summed into the existing data buffer; if one of the timing pulses "misses" its timing slot, the scan is rejected. After signal averaging is completed, any nonlinearity in the time scale can be properly compensated.

The smart triggering method is the simplest to implement; however, many scans would be wasted. The on-the-fly scale correction is more sophisticated and more time efficient in terms of wasted scans, but is more computationally intensive. Accordingly, the constraints of the application will likely determine which technique to use.

Metrology System

Figure 11:
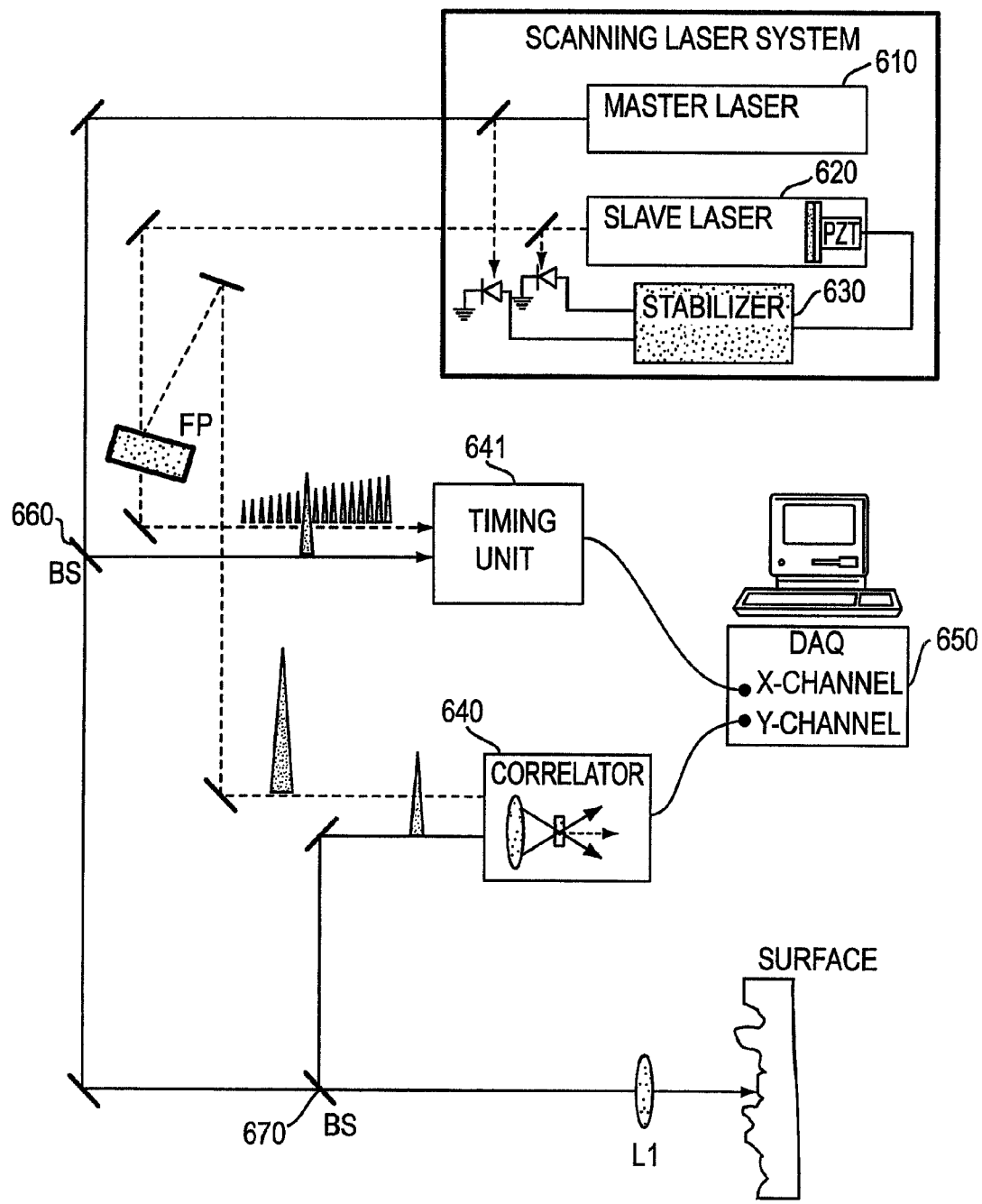
FIGS. 11(A) and (B) show metrology systems which employ a fast scanning laser system according to the present invention.

As an example of a more specific application, FIGS. 11(A) and (B) show preferred embodiments of a metrology system which employ the fast laser scanning technique of the present invention instead of the conventional moving-mirror method.

FIG. 11(A) shows an embodiment of a metrology system. Here, the beam from slave laser 620 is incident on the FP etalon which produces a sequence of pulses which are input to timing unit 641. The beam from master laser 610 is split by a normal beamsplitter BS 660. One part of the split beam of the slave laser 620 is input to timing unit 641. The other part of the beam is directed to the surface under test, which reflects the beam. The reflected beam is input to correlator 640. Also, the pulse reflected from FP etalon is input to correlator 640. Thus, correlator 640 is used for the object (experiment) to be measured, and timing unit 641 is used for the time scale calibration. The data stream corresponding to the object which is output from correlator 640, is input to the Y-channel of DAQ 650, and the data stream output from timing unit 641, which also includes a correlator, goes to the X-channel of DAQ 650. The timing unit data input to the X-channel provides a time scale, and the data output from correlator 640 and input to the Y-channel give object/surface distance information.

Figure 11B:
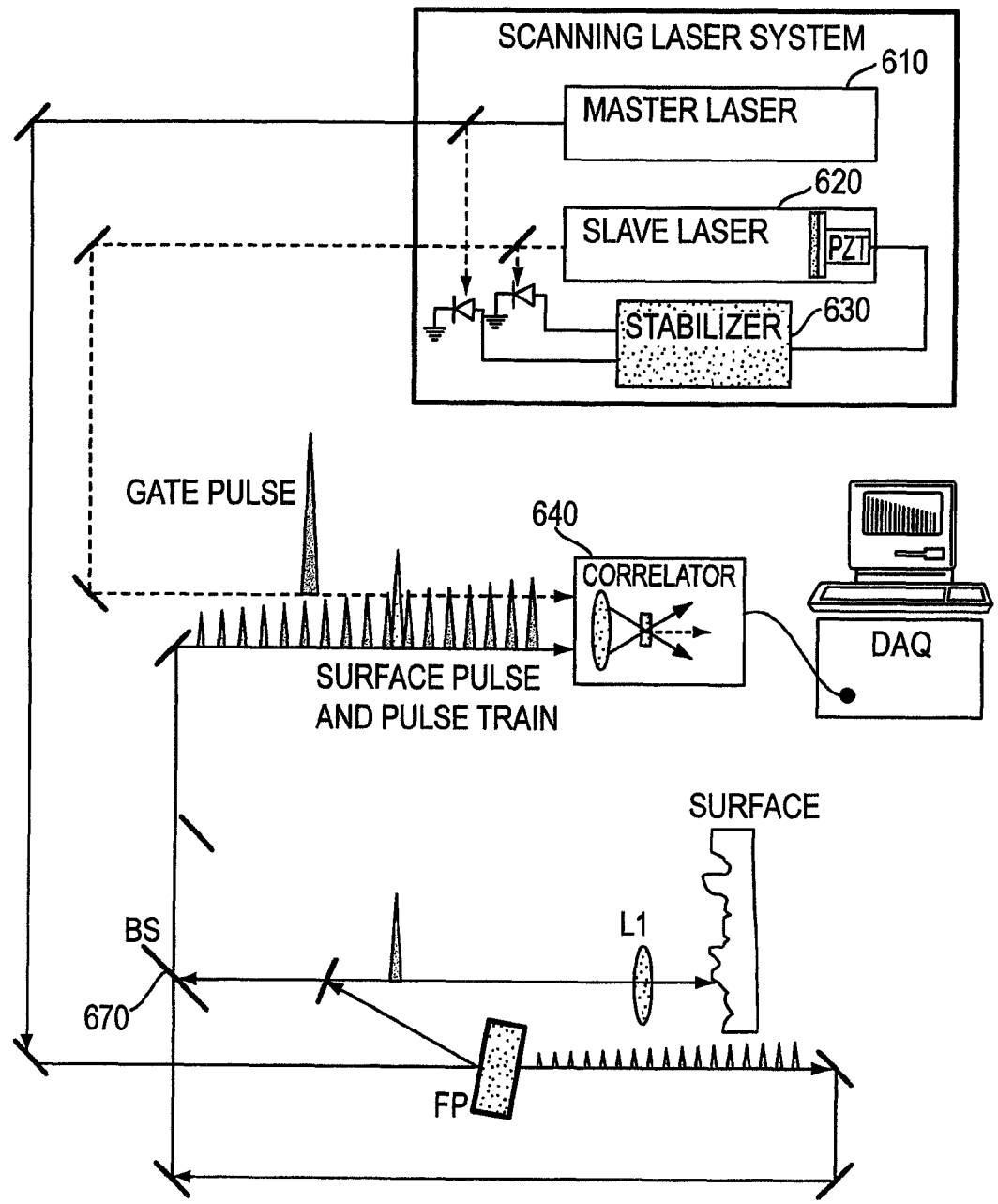

FIG. 11(B) shows another embodiment of a metrology system employing the techniques of the present invention. Here, the timing device (FP etalon) is put into a beam path to the object. The beam reflected from the FP etalon illuminates the object to measured. The light scattered from the object surface is collected by a lens L1, and is then recombined (via a beamsplitter BS 670) with the calibrated pulse train which is transmitted through the FP. The resulting cross-correlation between a gating pulse from slave laser 620 and this series of pulses from the target and etalon, gives the object range information (a single pulse) superimposed on the multi-pulse timing scale from the etalon. The result is a single data stream which contains both the object range information and the time scale calibration. The distance to the point on the object surface is then deduced by measuring the relative time delay between the object pulse and the timing pulses in the data stream. This comparison between the timing of the object pulse and the etalon pulses is a variation of a differential metrology method using ultrashort pulses.

In FIGS. 11(A) and (B), the FP etalons are shown to be oriented at a sharp angle with respect to the input beam. This angle of incidence has been exaggerated for clarity. Those skilled in the art will recognize that tilting the FP etalon away from normal incidence will cause increasing lateral displacements of each subsequent reflection from the etalon, as shown in FIG. 6. Therefore, it is desirable to use the etalon at an angle of incidence which is as small as is practical. It would be used at normal incidence if it is preceded by a polarizer and Faraday rotator. This spatial displacement will not degrade the correlator performance as long as it does not overfill the lens or any other aperture in the correlator.

Alternatively, this lateral displacement effect could be used to some advantage in modifying the shape of the pulse train envelope to be something other than a decaying exponential. This could occur via aperturing of the beams, or by the angular selectivity of the phase matching condition of the nonlinear mixing crystal in the correlator.

OTDR System

Figure 12:
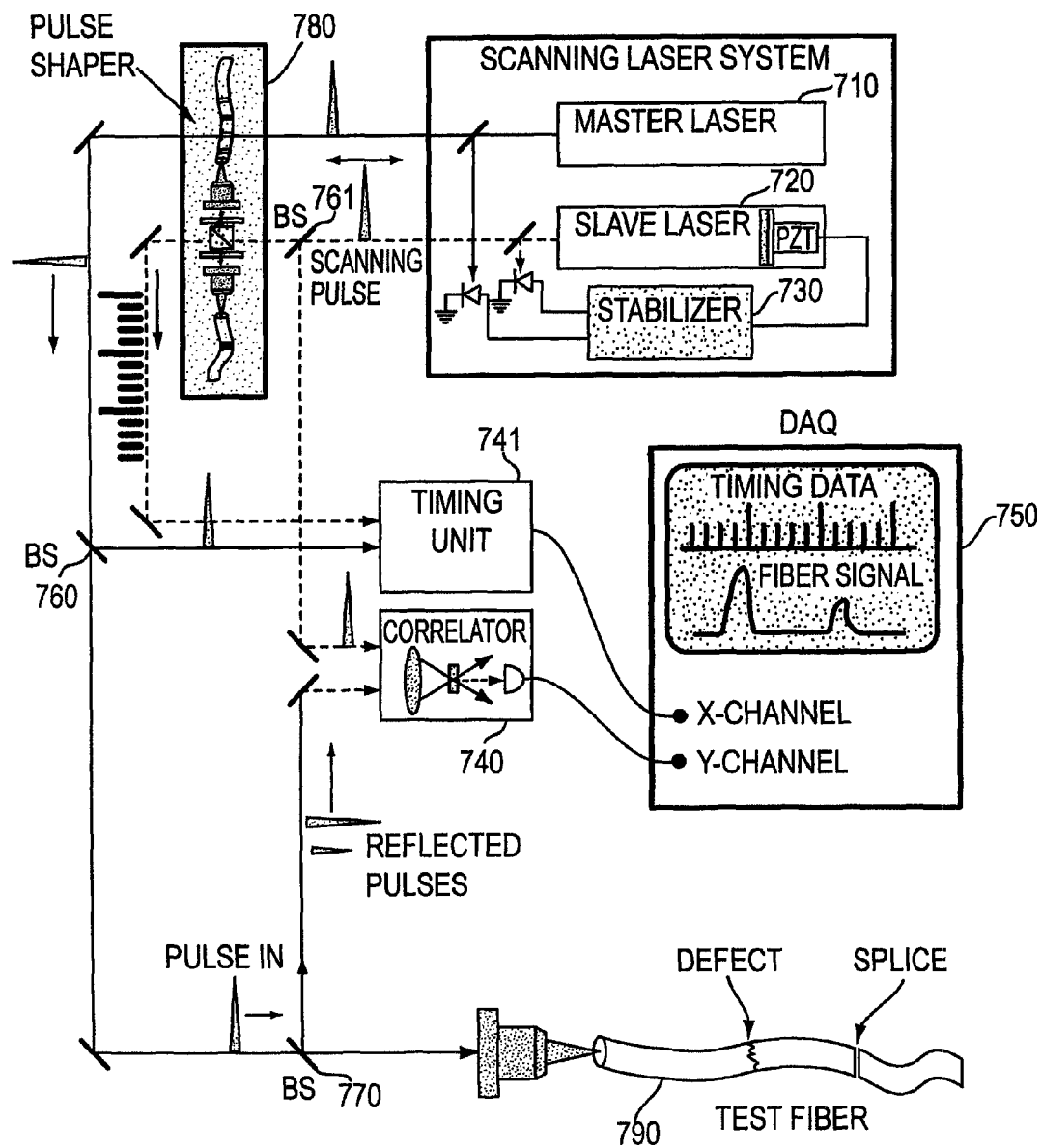
FIG. 12 shows a femtosecond OTDR system employing a fast scanning laser system and timing calibration method according to the present invention.

FIG. 12 is a schematic diagram of an optical time domain reflectometer (OTDR) system employing the fast scanning laser and timing systems of the present invention. The scanning laser system preferably is comprised of low repetition rate lasers (v~5-10 MHz) so that the usable unambiguous range is large. A short pulse from a master laser 710 is split into two beams by beam splitter BS 760. One of the split beams is sent to a timing unit 741, and the other is sent to a fiber or waveguide device under test (DUT) 790. Pulses reflected from surfaces, splices, defects, etc. in the DUT 790 are sent to a correlator 740 for precision timing/distance measurement with accuracies of ~10 fsec/~3 microns. This is accomplished according to the following method. Single pulses from slave laser 720 are split into two beams. One of the beams is sent to correlator 740 to be used as a gating pulse for the signal from the fiber. The other is sent to a pulse shaper 780 which produces pulse sequences which are in turn used by a timing unit 741, which is itself another correlator, to provide a calibrated time scale for the data acquisition (DAQ) unit 750. For a low repetition rate system such as 5 MHz ($T_R$=200 nsec), pulse shaper 780 must produce pulse sequences which more or less fill the entire 200 nsec timing interval. In the preferred embodiment, the pulse shaper would utilize chirped fiber Bragg gratings, as shown in FIG. 8(B).

Other configurations of the laser, timing units and correlators are possible. For example, the roles of the master and slave lasers 710 and 720, could be interchanged. The pulse shaper could also consist of a fiber FP etalon, or a fiber loop (either passive or with gain).

EO Sampling Oscilloscope

Figure 13:
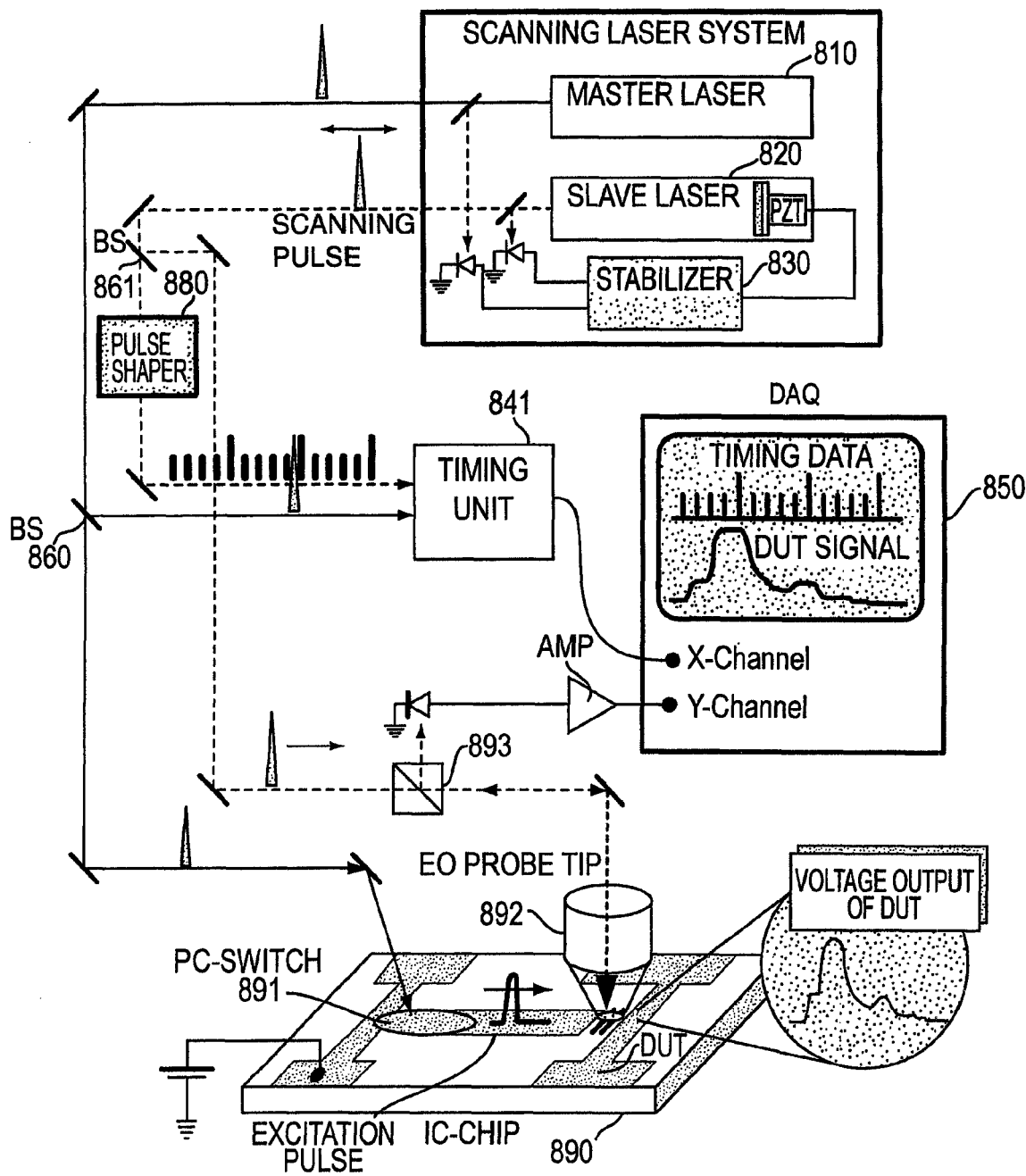
FIG. 13 shows an electro-optic sampling oscilloscope employing a fast scanning laser system and timing calibration method according to the present invention.

FIG. 13 shows a schematic diagram of a jitter-free electro-optic sampling oscilloscope using the fast scanning laser and timing system according to the present invention. This embodiment combines the well established non-contact EO-sample technique with the fast scanning technique described herein, thus providing much greater flexibility in time scale adjustment.

Pulses from master laser 810 are split into two beams. One beam is sent to a timing unit 841; the other pulse is sent to generate electrical pulses on the device under test (DUT), which in this case is mounted on an integrated circuit (IC) 890, via photo-conductive (PC) switch 891. Pulses from slave laser 820 are also split into two beams. One beam is sent to the electro-optic (EO) probe tip 892, and the other beam is sent to the pulse shaper 880 which produces a sequence of pulses, which in turn are sent to timing unit 841 for time scale calibration. The pulses returned from the EO probe tip 892 are modulated by the interaction between voltage from the DUT and the EO probe tip 892. These pulses are detected by polarizing optics 893 and sent to a Y-channel of DAQ 850. Accordingly, precision timing calibration is obtained in a similar manner as described for the OTDR of FIG. 12.

The timing delay, scanning interval, and scanning frequency are set to the desired values by the stabilizer 830. For example, if it is desired to increase the scanning frequency by a factor of two (but not the scan range), then it is necessary to double the modulation frequency of the PZT in slave laser 820, and to increase the PZT scanning voltage by a corresponding amount. On the other hand, to increase the scan range without changing the scan frequency, one simply increases the PZT scanning voltage. The relative delay of the time sweep range is adjusted by the phase control of stabilizer 830. This flexibility of time scale adjustment is similar to that afforded by the delaying time base of a conventional oscilloscope.

One could equally well use photoconductive sampling for this purpose. This has much higher sensitivity, however, the time resolution is limited to ~2 psec.

The most widely used applications of short laser pulses and scanning delays have been in pump-probe measurements of physical, chemical, & electronic systems. However, the range of applications for this technology is increasing rapidly, and their introduction into commercial products beyond the scientific market, is imminent. The rapid scanning and time calibration techniques described here can be used in almost any application which utilizes ultrafast laser pulses, because virtually all of these applications require some type of adjustable time delay between laser pulses. These applications include, but are not limited to, electo-optic testing of ultrafast electronic and optoelectronic devices characterization of charge dynamics in semiconductor materials and devices, all-optical signal processing photoconductive sampling, and various forms of time-resolved, nanometer probing. Additionally, there are a number of new applications being developed for terahertz beams to which these scanning methods could be applied including terahertz imaging, such as that disclosed by B. B. Hu et al., "Imaging with Terahertz Waves", Optics Letters, Vol. 20, No. 16, Aug. 15, 1995, pp. 1716-1719. Recently, ultrafast photodetectors have become commercially available, whose speed (50 GHz, 10 psec FWHM) far outstrips the measurement capability of commercial sampling oscilloscopes, such as Newport Corp. Model #PX-D7, manufactured by Picometrix. Subpicosecond lasers and scanning delays are required to take full advantage of the speed of these detectors. Furthermore, the scanning method of the present invention, because of its unusual versatility of scanning range selection, is especially appropriate for submillimeter-resolution laser radar, and profiling of remote targets. The flexibility of the scan range adjustments makes the fast-scanning system analogous to the adjustable time base on an oscilloscope.

The very high scan rate achievable with the fast-scanning methods described here, makes possible many new potential applications. The scan velocity parameter (see Tables 1-3) is a figure of merit which is particularly useful. Note that the scan velocities in Tables 1-3 range from 3 m/sec to 30,000 m/sec. Thus, supersonic scan velocities are possible with the free-scanning or fast scanning techniques, making them potentially useful for studies of, or applications involving, laser-induced acoustic and photoelastic effects in solids and liquids, for example. Such applications are not practical using conventional scanning methods because it would be necessary to move the scanning mirror at sonic velocities in a physical delay system, which is unrealistic.

The present invention has been described in connection with the preferred embodiments, and is not intended to be limited only to the above-described embodiments. Other modifications and variations to the invention will be apparent to those skilled in the art from the foregoing disclosure and teachings. Thus, while only certain embodiments of the invention have been specifically described herein, it will be apparent that numerous modifications may be made thereto without departing from the spirit and scope of the invention.

What is claimed is:

1. A short-pulse laser, comprising:
   a fiber laser for generating a pulse output; and
   an acoustically damped fiber spool, around which said fiber laser is wrapped to stabilize the output of said fiber laser.

2. A fiber laser system comprising:
   a first rare-earth doped fiber operable to conduct optical energy; and
   a spool around which said first fiber is wrapped,
   wherein said first rare-earth doped fiber is isolated from external environmental conditions in an isolation device for limiting the absolute timing drift and for stabilizing a repetition rate of said fiber laser system.

3. The fiber laser system as claimed in claim 2, further comprising:
   a second rare-earth doped fiber co-wrapped around said spool; and
   a single optical pump source operable to drive both said first and second rare-earth doped fibers.

4. The fiber laser system as claimed in claim 3, further comprising:
   a first Faraday rotator mirror at an end of said first rare-earth doped fiber;
   an optical assembly comprising a second Faraday rotator mirror and a piezoelectric transducer mounted on a mirror.

5. The fiber laser system as claimed in claim 3, wherein the fiber laser system comprises at least first and second mode locked fiber lasers, the system further comprising: at least two identical sets of modelocking optics, each set of modelocking optics comprising a waveplate, a Faraday rotator and a polarizable beamsplitter, wherein at least one set of modelocking optics is associated with said first rare-earth doped fiber and at least one other set of modelocking optics is associated with said rare-earth doped second fiber.

6. The fiber laser system as claimed in claim 2, wherein said rare-earth doped fiber is disposed in a fiber laser and mode locked to produce short optical pulses, and wherein changing the repetition rate of pulses output from said fiber laser is accomplished by changing the length of fiber laser cavity.

7. The fiber laser system as claimed in claim 6, wherein the length of said laser cavity is changed in a predetermined manner by applying a voltage signal to a piezoelectric unit disposed within a fiber laser cavity.

8. The fiber laser system as claimed in claim 7, wherein said voltage signal comprises a square wave, a rectangular wave, or a sinusoidal wave.

9. The fiber laser system as claimed in claim 6, wherein the length of said laser cavity is changed in a predetermined manner by applying a voltage signal to a piezoelectric unit disposed within the laser cavity.

10. The fiber laser system as claimed in claim 6, wherein said short optical pulses comprise at least one pulse having a pulse width less than 100 fs.

11. The fiber laser system as claimed in claim 2, wherein said isolation device comprises at least a temperature controlled enclosure.

12. A fiber laser system comprising:
   a first rare-earth doped fiber operable to conduct optical energy;
   a spool around which said first fiber is wrapped,
   a second rare-earth doped fiber co-wrapped around said spool; and
   a single optical pump source operable to drive both said first and second rare-earth doped fibers,
   wherein said first rare-earth doped fiber and said second rare-earth doped fiber are isolated from external environmental conditions in an isolation device for limiting the absolute timing drift and for stabilizing a repetition rate of said fiber laser system.

13. The fiber laser system as claimed in claim 12, wherein said isolation device comprises at least a temperature controlled enclosure.

14. The fiber laser system as claimed in claim 12, wherein said first and second rare-earth doped fibers of said fiber laser system are mode locked to produce respective first and second short optical pulses from respective first and second mode locked fiber lasers, and wherein changing the repetition rate of pulses output from a fiber laser is accomplished by changing the length of a laser cavity having a rare-earth doped fiber.

15. The fiber laser system as claimed in claim 14, wherein said first and second short optical pulses comprise at least one pulse having a pulse width less than 100 fs.

16. The fiber laser system as claimed in claim 14, wherein the length of said laser cavity is changed in a predetermined manner by applying a voltage signal to a piezoelectric unit disposed within a fiber laser cavity.

* * * * *